United States Patent
Thummalapally et al.

(10) Patent No.: US 7,629,812 B2
(45) Date of Patent: Dec. 8, 2009

(54) SWITCHING CIRCUITS AND METHODS FOR PROGRAMMABLE LOGIC DEVICES

(75) Inventors: Damodar R. Thummalapally, Milpitas, CA (US); Abhijit Ray, Sunnyvale, CA (US)

(73) Assignee: DSM Solutions, Inc., Los Gatos, CA (US)

( * ) Notice: Subject to any disclaimer, the term of this patent is extended or adjusted under 35 U.S.C. 154(b) by 0 days.

(21) Appl. No.: 11/888,977

(22) Filed: Aug. 3, 2007

(65) Prior Publication Data

US 2009/0033361 A1    Feb. 5, 2009

(51) Int. Cl.
*H03K 19/173*    (2006.01)
(52) U.S. Cl. .......................................... 326/38; 326/40
(58) Field of Classification Search ............. 326/37–41, 326/47
See application file for complete search history.

(56) References Cited

U.S. PATENT DOCUMENTS

| | | | |
|---|---|---|---|
| 3,412,286 A | 11/1968 | Grebene | |
| 3,930,300 A | 1/1976 | Nicolay | |
| 3,951,702 A | 4/1976 | Kano et al. | |
| 3,955,182 A | 5/1976 | Bert | |
| 3,967,305 A | 6/1976 | Zuleeg | |
| RE28,905 E | 7/1976 | Hodges ....................... | 340/173 |
| 4,064,525 A | 12/1977 | Kano et al. | |
| 4,126,900 A | 11/1978 | Koomen et al. | |
| 4,207,556 A | 6/1980 | Sugiyama et al. | |
| 4,228,367 A | 10/1980 | Brown | |
| 4,333,224 A | 6/1982 | Buchanan | |
| 4,485,392 A | 11/1984 | Singer ........................... | 357/22 |
| 4,516,040 A * | 5/1985 | Zapisek et al. ................ | 326/38 |
| 4,613,772 A | 9/1986 | Young | |
| 4,631,426 A | 12/1986 | Nelson et al. | |
| 4,663,543 A | 5/1987 | Sitch | |
| 4,698,653 A | 10/1987 | Cardwell, Jr. | |
| 4,743,862 A | 5/1988 | Scheinberg | |
| 4,751,556 A | 6/1988 | Cogan et al. | |
| 4,777,517 A | 10/1988 | Onodera et al. | |
| 4,853,561 A | 8/1989 | Gravrok | |
| 4,985,739 A | 1/1991 | Lapham et al. | |
| 5,130,770 A | 7/1992 | Blanc et al. .................... | 357/23 |
| RE34,363 E | 8/1993 | Freeman ....................... | 307/465 |
| 5,408,198 A | 4/1995 | Kusunoki | |

(Continued)

FOREIGN PATENT DOCUMENTS

EP    0193842    9/1986

(Continued)

OTHER PUBLICATIONS

U.S. Appl. No. 11/796,434, Not Published, Vora.

(Continued)

*Primary Examiner*—James Cho
(74) *Attorney, Agent, or Firm*—Haverstock & Owens, LLP

(57) ABSTRACT

A switching circuit can have a plurality of first signal lines of a programmable logic device, a plurality of second signal lines of the programmable logic device, and a plurality of switch elements. Each switch element can selectively couple one first signal line to a second signal line and include one or more switch junction field effect transistors (JFETs) having a first control gate separated from a second control gate by a channel region.

28 Claims, 9 Drawing Sheets

U.S. PATENT DOCUMENTS

| | | | |
|---|---|---|---|
| 5,618,688 | A | 4/1997 | Reuss |
| 5,764,096 | A | 6/1998 | Lipp et al. ............. 327/434 |
| 5,773,891 | A | 6/1998 | Delgado |
| 5,808,502 | A | 9/1998 | Hui et al. |
| 5,973,341 | A | 10/1999 | Letavic et al. |
| 6,307,223 | B1 | 10/2001 | Yu |
| 6,781,409 | B2 * | 8/2004 | Turner ............. 326/41 |
| 6,940,307 | B1 * | 9/2005 | Liu et al. ............. 326/38 |
| 7,141,853 | B2 * | 11/2006 | Campbell et al. ............. 257/347 |
| 7,307,445 | B2 * | 12/2007 | Liang et al. ............. 326/26 |
| 2002/0197779 | A1 | 12/2002 | Evans |
| 2007/0008013 | A1 | 1/2007 | Fijany et al. |
| 2007/0096144 | A1 | 5/2007 | Kapoor |
| 2007/0126478 | A1 | 6/2007 | Kapoor |
| 2007/0284628 | A1 | 12/2007 | Kapoor |

FOREIGN PATENT DOCUMENTS

| | | |
|---|---|---|
| EP | 0 276 760 A1 | 8/1988 |
| GB | 1268175 | 3/1972 |
| GB | 2208967 A | 4/1989 |
| JP | 59 061317 A | 4/1984 |
| JP | 60-258948 | 12/1985 |
| JP | 60258948 A | 12/1985 |
| NL | 7 203 662 A | 9/1972 |

OTHER PUBLICATIONS

Hamadè, Adib R., "A JFET/Bipolar Eight-Channel Analog Multiplexer", *IEEE Journal of Solid-State Circuits*, Dec. 1975, pp. 399-406, vol. SC-10, No. 6.

Takagi et al., "Complementary JFET Negative-Resistance Devices", *IEEE Journal of Solid-State Circuits*, Dec. 1975, pp. 509-515, vol. SC-10, No. 6.

Lehovec, Kurt, "Analysis of GaAs FET's for Integrated Logic", *IEEE Transactions on Electron Devices*, Jun. 1980, pp. 1074-1091, vol. ED-27, No. 6.

Ozawa, Osuma, "Electrical Properties of a Triode-Like Silicon Vertical-Channel JFET", *IEEE Transactions on Electron Devices*, Nov. 1980, pp. 2115-2123, vol. ED-27, No. 11.

Nanver et al., "Design Considerations for Integrated High-Frequency p-Channel JFET's", *IEEE Transactions on Electron Devices*, Nov. 1988, pp. 1924-1934, Vol. 35, No. 11.

Moulic, J., "Field Effect Transistor Shifted Logic", *IBM Technical Disclosure Bulletin*, vol. 33, No. 3A, Aug. 1990, pp. 343-346.

PCT International Search Report and Written Opinion of the International Searching Authority for International Application, PCT/US2007/071075, dated Apr. 25, 2008.

English Abstract of JP 59 061317 from the European Patent Office.

Kuon, Ian Carlos, "Automated FPGA Design, Verification and Layout" Thesis for Degree of Master of Applied Science, Graduate Department of Electrical and Computer Engineering, University of Toronto, 2004, p. 71.

Muggli, R.A., "Double Gate Bipolar Compatible N-Channel Junction FET", *IBM Technical Disclosure Bulletin*, vol. 24, No. 2, Jul. 1981, pp. 997-998.

Wong, W. W. et al., "A Unified Four-Terminal JFET Static Model for Circuit Simulation", *Solid-State Electronics*, vol. 34, No. 5, pp. 437-443, 1991.

PCT International Search Report and Written Opinion of the International Search Authority for International Application No. PCT/US2008/071338, dated Nov. 18, 2008.

* cited by examiner

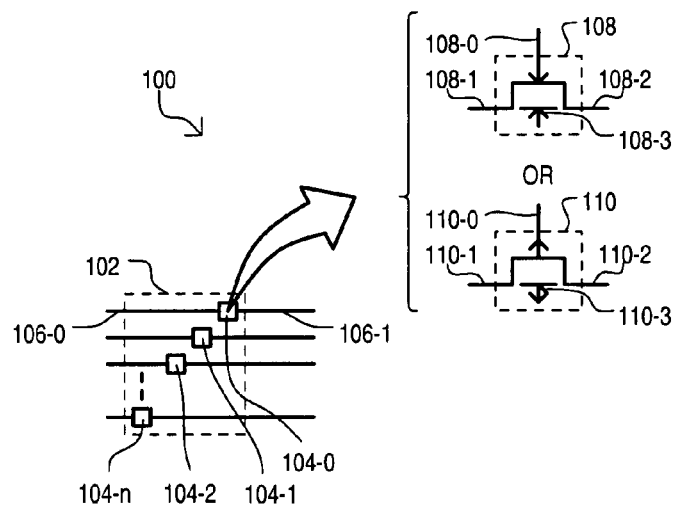
FIG. 1
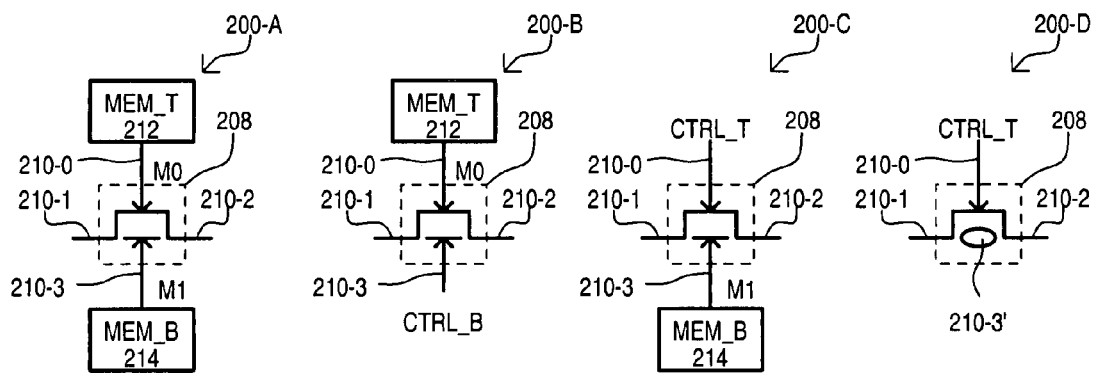
FIG. 2A    FIG. 2B    FIG. 2C    FIG. 2D
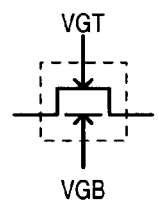
FIG. 3A
FIG. 3B
| VGT | VGB | N_EN | N_DEP | P_EN | P_DEP |
|-----|-----|------|-------|------|-------|
| VL  | VL  | OFF  | ON    | ON+  | ON+   |
| VL  | VH  | ON   | ON+   | ON   | ON+   |
| VL  | VLL | OFF  | OFF   | ✕    | ✕     |
| VL  | VHH | ✕    | ✕     | OFF  | ON    |
| VH  | VL  | ON   | ON+   | ON   | ON+   |
| VH  | VH  | ON+  | ON+   | OFF  | ON    |
| VH  | VLL | OFF  | ON    | ✕    | ✕     |
| VH  | VHH | ✕    | ✕     | OFF  | OFF   |
| VLL | VL  | OFF  | OFF   | ✕    | ✕     |
| VLL | VH  | OFF  | ON    | ✕    | ✕     |
| VLL | VLL | OFF  | OFF   | ✕    | ✕     |
| VLL | VHH | ✕    | ✕     | ✕    | ✕     |
| VHH | VL  | ✕    | ✕     | OFF  | ON    |
| VHH | VH  | ✕    | ✕     | OFF  | OFF   |
| VHH | VLL | ✕    | ✕     | ✕    | ✕     |
| VHH | VHH | ✕    | ✕     | OFF  | OFF   |

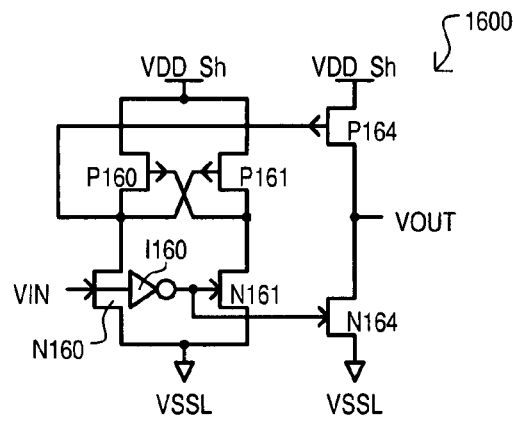
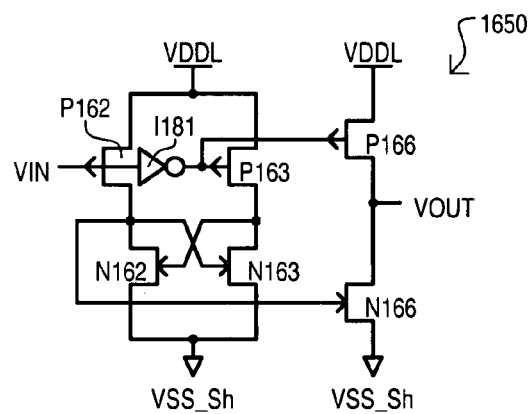
FIG. 16A
FIG. 16B
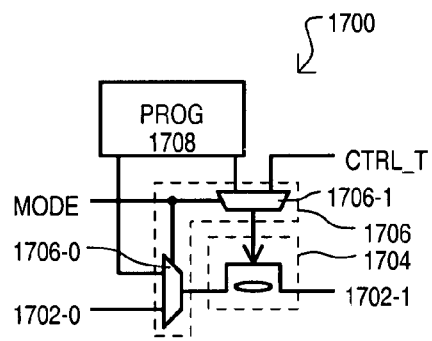
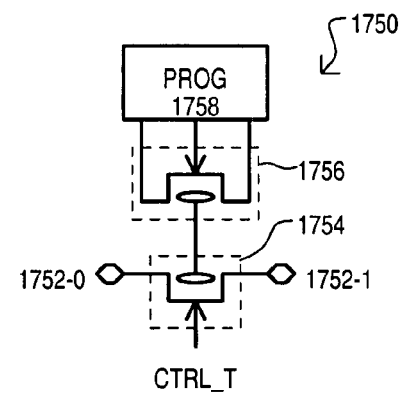
FIG. 17A
FIG. 17B
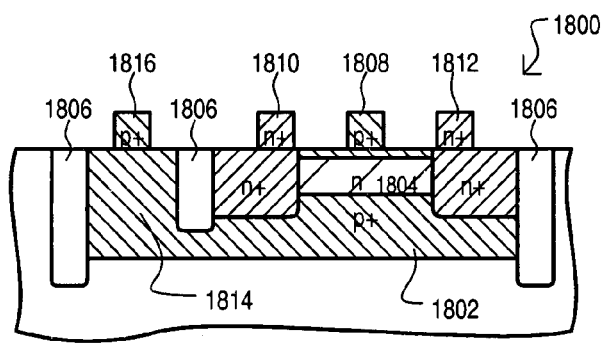
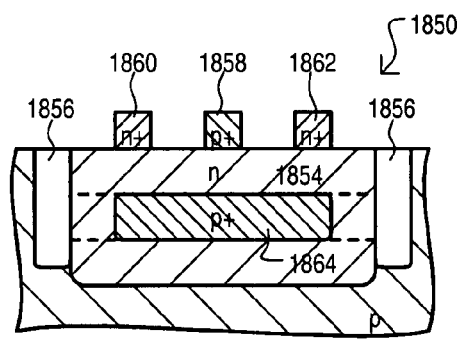
FIG. 18A
FIG. 18B

SWITCHING CIRCUITS AND METHODS FOR PROGRAMMABLE LOGIC DEVICES

TECHNICAL FIELD

The present invention relates generally to semiconductor integrated circuit devices, and more particularly to switching circuits that can be programmed into different configurations, such as switching circuits included in programmable logic devices.

BACKGROUND OF THE INVENTION

Integrated circuit (IC) devices can include a number of sections formed in one or more substrates that are electrically interconnected to one another. In order to provide increased operating speeds, it is desirable to provide as fast a signal transmission speed as possible for signal paths that interconnect different sections. For some integrated circuit devices, critical timing paths can be identified prior to the fabrication of the device, and thus optimized (e.g., utilize large signal driving devices, minimize routing lengths, increase signal line cross sectional size to reduce resistance).

However, for other integrated circuit devices signal paths can be configured after the device has been manufactured, by connecting different signal paths with switches. In such cases, complete signal routing paths are unknown at the time of fabrication and thus cannot be optimized in the manner described above. Further, because configuration of signal paths can depend upon a series of switches, signal switch construction can limit overall performance of the devices. For example, programmable logic devices (PLDS) can often include signal paths configurable by enabling (placing into a relatively low impedance state) or disabling (placing into a relatively high impedance state) various switching devices. Programmable logic devices can include, as but a few examples, complex PLDs (CPLDs) and programmable gate arrays (PGAs) including field PGAs (FPGAs).

Thus, it can be desirable to reduce both resistance and capacitance along programmable switching paths to as great an extent as is possible.

Another issue that can be presented by PLD devices is that of bus contention. A typical PLD can include a number of volatile storage circuits that store configuration data for enabling logic functions and/or switch paths within the PLD. However, when power is initially applied to the device, or the device is reset, such storage circuits can initially assume essentially random states. This can potentially lead to different blocks of a PLD driving a same bus line to different potentials.

To better understand various features of the disclosed embodiments, a conventional switching arrangement for an FPGA will now be described.

Referring now to FIG. 21, a portion of a conventional FPGA is shown a block diagram and designated by the general reference character 2100. Conventional FPGA 2100 can include a logic block 2102, connection blocks 2104-0 and 2104-1, and a switch block 2106. Logic block 2102 can provide a logic function determined according to stored configuration data.

Connection blocks (2104-0 and 2104-1) can selectively connect inputs of logic block 2102 or outputs from logic block 2102 to routing signal lines. In the particular example of FIG. 21, connection block 2104-0 can provide programmable connections between a horizontal routing path 2108 and logic block 2102. Connection block 2104-1 can provide programmable connections between vertical routing path 2110 and logic block 2102.

Switch block 2106 can provide programmable connections for horizontal routing path 2108, for vertical routing path 2110, and for connecting signal lines of such paths to one another.

When power is initially applied to conventional FPGA 2100, the configuration data establishing the operation of logic block 2102 and/or the configuration data controlling the connection blocks (2104-0 and 2104-1) can be indeterminate. As a result, different logic blocks (e.g., 2102) can drive same lines along a routing path (2108 and 2110) to different levels. Such a result can draw undesirable large amounts of current, prevent or delay a subsequent configuration data writing operation, or even cause the FPGA 2100 to fail.

One conventional approach to addressing bus contention is to provide additional logic to control each switch within a connection block and/or switch block. Such logic ensures switches within such blocks are turned off until the FPGA 2100 device has been powered up and is stable. A drawback to such an approach can be the increase in switch size. In particular, if a switch is composed of a single metal-oxide-semiconductor (MOS) type switch transistor, utilizing a two-input complementary MOS (CMOS) NAND (or NOR) gate to control the switch can require an additional four transistors per switch, greatly increasing the overall area for the FPGA, as such devices can include many thousands or millions of such switches.

Yet another issue presented by PLD devices can be configuration data writing operations. In an FPGA, for example, configuration data can be shifted into a device in a serial fashion to configuration storage locations or write registers. In the latter case, such write registers can then be utilized to write data into configuration storage locations. In order to provide efficient use of FPGA resources, signal routing lines can serve dual purposes. In a programming operation, selected of such lines can be used to carry configuration data to configuration storage locations or write registers. However, once the device is programmed, such signal lines can be configured to route signals between logic blocks according to configuration data.

In order to provide such dual use functions, switch blocks (e.g., 2106 of FIG. 21) can include logic between configuration data stores and switches that can force switches into a particular state in order to route configuration data along a particular path. This can also consume valuable area in an FPGA device.

BRIEF SUMMARY OF THE INVENTION

The invention can include a switching circuit having a plurality of first signal lines of a programmable logic device, a plurality of second signal lines of the programmable logic device, and a plurality of switch elements. Each switch element can selectively couple one first signal line to a second signal line and include one or more switch junction field effect transistors (JFETs) having a first control gate separated from a second control gate by a channel region.

The invention can also include a method of enabling signal paths in a programmable logic device. The method can include the steps of: in response to the first mode indication, disabling connection blocks to isolate outputs of configurable logic blocks from signal routing lines running between such configurable logic blocks by applying predetermined signals to second gates of switch junction field effect transistors (JFETs) within the connection blocks, the switch JFETs having first gates coupled to receive configuration data.

The invention can also include a programmable logic device having a plurality of circuit blocks. Each circuit block can be configurable in response to user provided data values applied at first gates of switch junction field effect transistors (JFETs) and control signals applied at second gates of the switch JFETs.

BRIEF DESCRIPTION OF THE DRAWINGS

FIG. 1 is a block schematic diagram of a switching circuit according to a first embodiment of the present invention.

FIGS. 2A to 2D shows examples of switch control arrangements according to embodiments of the invention.

FIGS. 3A and 3B show examples of switch junction field effect transistor (JFET) operations that can be included in the embodiments.

FIGS. 16A and 16B show level translator circuits that can be included in storage circuits like those of FIGS. 14A to 14C.

FIGS. 17A and 17B show switch elements with "built-in" configuration data stores according to an embodiment.

FIGS. 18A and 18B are side cross sectional views of JFET devices that can be included in embodiments of the invention.

DETAILED DESCRIPTION OF THE EMBODIMENTS

Figure 4:
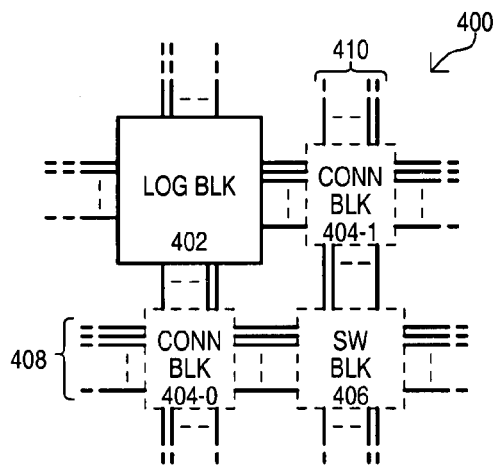
FIG. 4 shows an integrated circuit (IC) device according to one embodiment.

Various embodiments of the present invention will now be described in detail with reference to a number of drawings. The embodiments show structures, designs, and methods for configurable switching circuits that can be included in programmable logic devices, and the like.

Referring now to FIG. 1, a switching circuit according to a first embodiment is shown in a block schematic diagram and designated by the general reference character 100. A switching circuit 100 can include a block 102 having a number of switch devices 104-0 to 104-n that can provide a programmable connection between one signal line and another. For example, in the particular case of FIG. 1, switch device 104-0 can provide a programmable connection between signal line 106-0 and 106-1.

Each switch device (104-0 to 104-n) can include one or more junction field effect transistors (JFETs), where such JFETs include at least two control gates. This is represented in FIG. 1, which shows that switch element 104-0 can include an n-channel enhancement mode JFET (nJFET) 108 or a p-channel enhancement mode JFET (pJFET) 110, or both.

The utilization of JFETs can provide a number of advantages over conventional arrangements. First, such switch JFETs (108 and/or 110) can be operated in low voltage ranges, such as below a p-n junction cut-in voltage. As but one example, switching levels for such devices can remain within a range of less than about 0.7 volts, preferably no more than 0.5 volts. Such low operating voltages can provide for reductions power consumption. At the same time, switch JFETs can draw less leakage current as compared to short channel insulated gate field effect transistors.

A second advantageous feature can be that each switch JFET (108 and/or 110) can be independently controlled by one of either control gate. For example, and as will be described in greater detail below, such an arrangement can allow switch JFETs to receive configuration data via one gate and a control signal via the other gate. Control signals can be utilized to force the JFETs into a particular state regardless of the corresponding configuration data, or to alter a channel conductivity established by the configuration data.

Referring still to FIG. 1, an nJFET 108 can include a first gate 108-0, a source 108-1, a drain 108-2 and a second gate 108-3. It is noted that either a first gate 108-0 or a second gate 108-3 can be an isolated gate that can retain charge. That is, one gate of nJFET 108 need not be directly connected to a signal line, but can be charged according to various methods, as will be described below. Similarly, a pJFET 110 can include a first gate 110-0, a source 110-1, a drain 110-2 and a second gate 110-3. As in the case of nJFET 108, one gate of pJFET 110 can be an isolated gate.

In this way, a switch circuit can include a number of switch devices, each of which is composed of one or more JFETs having two control gates.

According to embodiments of the invention, a switch JFET can have at least one control gate that receives a value from a memory circuit. A memory circuit can store configuration data provided by a user. Thus, a switch JFET can be placed into one state by driving one control gate according to configuration data, but changed to a different state without having to alter the configuration data, by driving a second control gate. Various possible switch control arrangements are shown in FIGS. 2A to 2D.

In one very particular arrangement, FIGS. 2A to 2D can be considered related to FIG. 1 in that that the illustrated switch control arrangements can be included in one or more of switch elements 104-0 to 104-n.

Referring now to FIG. 2A, an nJFET switch control arrangement is shown in block schematic diagram and designated by the general reference character 200-A. Switch arrangement 200-A can includes an nJFET 208, a first storage circuit 212, and a second storage circuit 214. An nJFET 208 can provide a configurable signal path between a source 210-1 and drain 210-2.

A first storage circuit 212 can receive and store a first configuration data value M0. For example, a value M0 can be user provided configuration data. Data value M0 can be applied to a first gate 210-0 of nJFET 208. A second storage circuit 214 can receive and store second configuration data value M1. As in the case of data value M0, a value M1 can be user provided configuration data. Data value M1 can be applied to a second gate 210-3 of nJFET 208. In the very particular arrangement of FIG. 2A, a first gate 210-0 can be a top gate formed on a channel formed in a substrate, while a second gate 210-3 can be a bottom gate formed below a channel formed in the substrate.

Thus, in the arrangement of FIG. 2A, a state of a signal path through nJFET 208 can be controlled by a two different stored data values M0 and M1. This in contrast to conventional metal-oxide-semiconductor (MOS) switch approaches that can control a switch with a single programmable value. Such a switch control arrangement can allow greater variability in the way in which a device is programmed. For example, and as will be described in more detail below, a first set of configuration data values can be used to enable nJFETs to either conduct or not conduct. A second set of configuration data values can be used to optimize signal timing by reducing a channel resistance of selected nJFET switches.

Referring now to FIG. 2B, another switch control arrangement 200-B is shown in a block schematic diagram. FIG. 2B includes some of the same general items as FIG. 2A, thus like items are referred to by the same reference character. FIG. 2B can differ from that of FIG. 2A in that a second gate 210-3 can be driven by a control signal CTRL_B. A control signal CTRL_B can be generated in response to predetermined conditions of a corresponding integrated circuit. For example, a control signal CTRL_B can vary according to mode, allowing an nJFET 208 to have one function according to configuration data (e.g., M0), but switching the nJFET 208 to another state by operation of control signal CTRL_B. Even more particularly, such an arrangement can allow groups of switches to be enabled or disabled together, or enable groups of switches to assume a predetermined function (enable write data paths, test paths, etc.).

FIG. 2C shows the same general arrangement as FIG. 2C, but a first gate 210-0 can be driven by a control signal CTRL_T, while a second gate 210-3 can be driven by a second storage circuit 214.

Referring now to FIG. 2D, another arrangement is shown in a block schematic diagram and designated by the general reference character 200-D. The arrangement of FIG. 2D can differ from those of FIGS. 2A to 2C, in that a second gate 210-3' gate can be an isolated gate. An isolated gate can be gate that can store charge, and thus vary a channel conductivity. For example, a second gate 210-3' can be a p-doped semiconductor material adjacent an n-doped channel region, and otherwise surrounded by n-type semiconductor material or isolation material. A second gate 210-3' can be programmed to store a configuration data value. Thus, a switch arrangement 200-D can be conceptualized as including a "built-in" storage circuit. Various examples of isolated gate switching structures will be described in more detail below.

While FIGS. 2A to 2D show switching arrangements with nJFETs, switching arrangements according to other embodiments can include pJFETs having the same possible gate connection variations.

In this way, switching arrangements can provide two terminals to control a switching configuration for a single switching device.

Referring now to FIGS. 3A and 3B, a diagram and table illustrate very particular examples of possible JFET switch operations. FIG. 3A shows the general control inputs that can be applied to an nJFET, a first (e.g., "top") gate voltage VGT and a second (e.g., "bottom") gate voltage VGB. Voltages VGT and VGB can be used individually and/or in combination to alter the conductivity of a source-drain path through the nJFET. It is understood that a PJFET can receive a similar combination of gate voltages.

In very particular embodiments, voltages VGT and VGB can be used to enable, a source-drain path (place it into a relatively low impedance state), disable the source-drain path (place it into a relatively high impedance state), or provide more than one on state (switch between low and very low impedance states).

FIG. 3B shows various combinations of values for VGT and VGB, and resulting states of a switch JFET. Columns "VGT" and "VGB" show two possible low and high voltage values. A value VL can be a "standard" low voltage value that can serve as a logic low level, and in one example can be about 0 volts. A value VH can be a "standard" high voltage value that can serve as a logic high level, and in one example can be about +0.5 volts. A value VLL can be a "boosted" low voltage value that can be below a standard low voltage value. In one particular case, such a value can be about −0.5 volts. Similarly, a value VHH can be a "boosted" high voltage value that can be above a standard high voltage value. In one particular case, such a value can be about +1.0 volts.

FIG. 3B also shows responses for various types of switching JFETs, including an enhancement mode nJFET, shown by column "N_EN", a depletion mode nJFET, shown by column "N_DEP", an enhancement mode pJFET, shown by column "P_EN", a depletion mode pJFET, shown by column "P_DEP". Responses for such devices to the different types of gate voltages are generally categorized into three groups: ON, ON+, and OFF. A value "ON" indicates a relatively low impedance value that can enable a signal to be transmitted through a switching JFET. A value "ON+" indicates an impedance lower than the "ON" case. A value "OFF" indicates a relatively high impedance that effectively prevents a signal from being transmitted through a switching JFET. Of course particular impedance values for ON and ON+ states can vary according to device construction (i.e., doping profiles, channel dimensions, semiconductor material used), applied gate voltage(s), and device conductivity type (i.e., p-channel or n-channel). Some responses of FIG. 3B are a shown by an "X". These responses indicate invalid states that can forward bias a pn junction between a gate and source.

In this way, a programmable logic device can provide switches having more than two states.

Having described JFET switching devices and modes of operation, an integrated circuit device including such structures will now be described.

Referring now to FIG. 4, an integrated circuit (IC) device according to one embodiment is shown in a block schematic diagram and designated by the general reference character 400. An IC device 400 can include a logic block 402, one or more connections blocks (two shown as 404-0 and 404-1), one or more switch blocks 406, and one or more routing paths (two shown as 408 and 410).

In one very particular example, an IC device 400 can be considered related to the embodiments of FIGS. 1 to 3B in that it can include switching devices like those illustrated in these previously described embodiments.

A logic block 402 can provide a programmable logic functions that can vary according to received configuration data. Thus, configuration stores (not shown in FIG. 4) can be written with configuration data, and such configuration data can be applied to programmable circuits within logic block 402 to thereby provide a given function. In a power-Lip operation, configuration stores do not yet store configuration data, and thus can output essentially random values to associated connection blocks (404-0 and 404-1).

Connection blocks (404-0 and 404-1) can provide programmable connections between routing paths (408 and 410) and logic block 402 that can be established according to configuration data. As in the case of logic block 402, in a power-up operation, configuration data can be initially in unknown states. To address potential bus contention problems arising from opposite logic values being output to a same routing line, at least the output paths of connection blocks (404-0 and 404-1) can be automatically placed into a high impedance state. However, unlike conventional approaches that utilize additional logic for connection block switches, a connection block (404-0 and 404-1) can drive one gate of switch JFETs within the connection blocks to produce such a high impedance state.

A switch block 406 can provide interconnections along and between routing paths (408 and 410) that are programmable according to configuration data. In addition, a switch block 406 can be placed into a predetermined configuration to enable signal paths through an IC device. As but one very particular example, it may be desirable to enable routing path 408 to maintain a single routing direction (i.e., horizontal in FIG. 4), while another routing path 410 maintains a second, different routing direction (i.e., vertical in FIG. 4). However, unlike conventional approaches that utilize additional logic for switch block switches, switch block 406 can drive one gate of switch JFETs within switch block 406 to produce such a predetermined configuration.

Figure 5A:
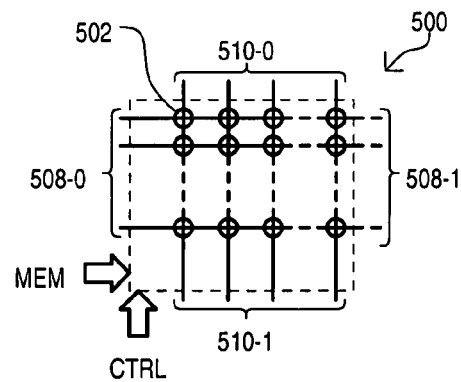
FIGS. 5A to 5C show examples of circuits that can be included in the IC device of FIG. 4.
Figure 5B:
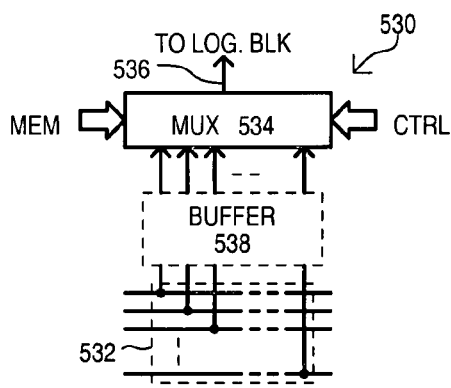
Figure 5C:
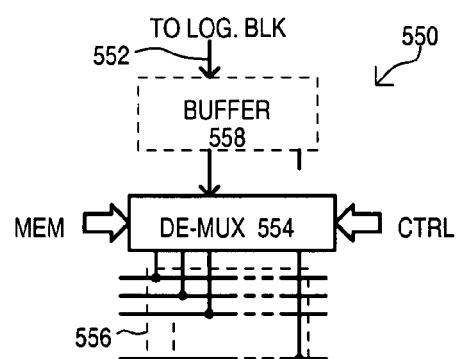

Referring now to FIGS. 5A to 5C, possible examples of circuits like those shown in FIG. 4 are shown in block schematic diagrams.

Referring now to FIG. 5A, an example of a switch block according to one embodiment is shown in a block schematic diagram and designated by the general reference character 500. A switch block 500 can include a first signal line set 508-0 and second signal line set 508-1 disposed in a first routing path direction (horizontal in the example shown) as well as third signal line set 510-0 and fourth signal line set 510-1 disposed in a second routing path direction (vertical in the example shown). A switch block 500 can also include a number of switching circuits (one shown as 502) arranged to provide programmable connections between the various signal lines of sets 508-0, 508-1, 510-0 and 510-1. Each switching circuit 502 can include one or more switch JFETs, each having at least two control gates. Various examples of switch circuits for such a switch block will be described in more detail below.

A switch block 500 can include configuration data inputs MEM as well as one or more control inputs CTRL. Configuration data inputs MEM can be generated from configuration data storage circuits (not shown). Control inputs CTRL can be generated by circuits within an IC device. For example, control signals CTRL can have different values depending upon mode of operation. Each switching circuit 502 can receive both configuration data (i.e., at inputs MEM) as well as one or more control signals (i.e., at inputs CTRL). Such an arrangement allows switching circuits 502 (and hence switch block 500) to be configured based on configuration data as well as control signals.

Referring now to FIG. 5B, one possible example of an input circuit for a connection block is shown in a block schematic diagram and designated by the general reference character 530. An input circuit 530 can have routing path input connections 532, a multiplexer (MUX) circuit 534, logic block input(s) 536, and optionally input buffers 538. Routing path input connections 532 can be conductive connections to multiple routing signal lines, such as those running between logic blocks of a programmable logic device.

A MUX circuit 534 can selectively connect a number of inputs received from routing path input connections, to a smaller number of logic block inputs. FIG. 5B shows one logic block input 536. A MUX circuit 534 can be controlled by configuration data inputs MEM as one or more control inputs CTRL. More particularly, configuration data inputs MEM can create input paths through MUX circuit 534 based on configuration data provided by a user, or the like, to provide a programmable function. A control input CTRL can be used to place MUX circuit 534 into a predetermined state based on a mode of operation.

While FIG. 5B shows an arrangement in which input buffers 538 are situated at inputs to MUX circuit 534, other buffers could be situated at an output of MUX circuit 534.

Referring now to FIG. 5C, one possible example of an output circuit for a connection block is shown in a block schematic diagram and designated by the general reference character 550. An output circuit 550 can have one or more logic block outputs (one shown as 552), a de-multiplexer (de-MUX) circuit 554, routing path output connections 556, and optionally, output buffers 558. A logic block output 552 can be an output signal line from a logic block and provided as an input to de-MUX circuit 554.

A de-MUX circuit 554 can selectively connect a logic block output 552 to any of a number of routing path output connections 556. Like a MUX circuit of FIG. 5B, a de-MUX circuit 554 can be controlled by configuration data inputs MEM as well as one or more control inputs CTRL. Configuration data inputs MEM can be stored values provided by a user, or the like, that configure de-MUX according to a desired function. Control inputs CTRL can place g de-MUX circuit 554 into a predetermined state based on a mode of operation. Even more particularly, in a power-up mode of operation, in response to control inputs CTRL, de-MUX circuit 554 can isolate logic block output 552 from routing path output connections 556. Such an arrangement can address the problem of bus contention by preventing a logic block output 552 from affecting corresponding routing signal lines in a power-up operation.

In this way, an IC device can include various blocks having JFET switching devices controlled according to configuration data and control signals.

Figure 6:
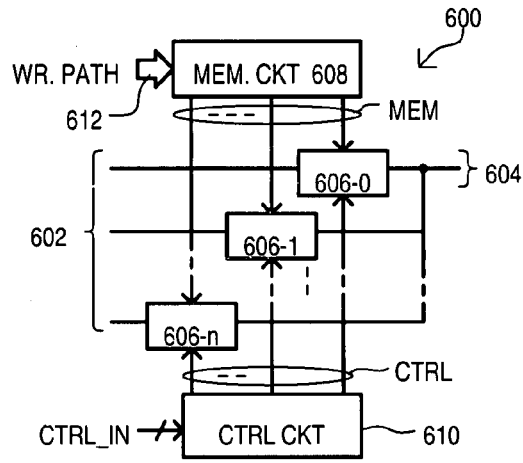
FIG. 6 shows a programmable path circuit according to an embodiment.

Referring now to FIG. 6, a programmable path circuit according to an embodiment is shown in a block schematic diagram and designated by the general reference character 600. A programmable path circuit 600 can be considered related to the embodiments of FIGS. 1 to 3B in that it can include switching devices like those illustrated in previously described embodiments. Further, in very particular arrangements, a programmable path circuit 600 can be a MUX circuit, like that shown in FIG. 5B or a de-MUX circuit like that shown in FIG. 5C.

A programmable path circuit 600 can include a first input/output (I/O) set 602, a second I/O set 604, switching devices 606-0 to 606-n, a memory circuit 608, and a control circuit 610. A first I/O set 602 can include more I/Os than a second I/O set 604.

In the particular arrangement of FIG. 6, a first I/O set 602 can include n+1 I/Os, while a second I/O set 604 can include one I/O. Switching devices (606-0 to 606-n) can selectively enable conductive paths between first I/O set 602 and second I/O set 604. In such an arrangement, if first I/O set 602 is composed of inputs, programmable path circuit 600 can operate as a MUX circuit. Conversely, if second I/O set 604 is an input, programmable path circuit 600 can operate as a de-MUX circuit. Switching devices (606-0 to 606-n) preferably include JFET devices, even more preferably include JFET devices having two control gates.

Memory circuit 608 can include a number of storage elements accessible by a write path 612. For example, configuration data values can be written into memory circuit 608 by way of write data path 612. Memory circuit 608 can output separate configuration data values (shown collectively as MEM) to each switching device (606-0 to 606-$n$), to thereby control the operation of such switching devices.

Control circuit 610 can receive control input signals CTRL_IN, and in response, generate control inputs (shown collectively as CTRL) to each switching device (606-0 to 606-$n$). It is noted that control inputs CTRL provided to each switching device (606-0 to 606-$n$) can be the same signal, or can be different signals. Further, control inputs can have one set of values in one mode, and a different set of values in another mode.

In this way, a programmable circuit path can include switching devices that can be controlled by signals generated by both a memory circuit and a control circuit.

The programmable circuit path of FIG. 6 shows a switching circuit having a single level of hierarchy. However, other embodiments can have higher levels of hierarchy. One very particular example of such an arrangement is shown in FIG. 7.

Figure 7:
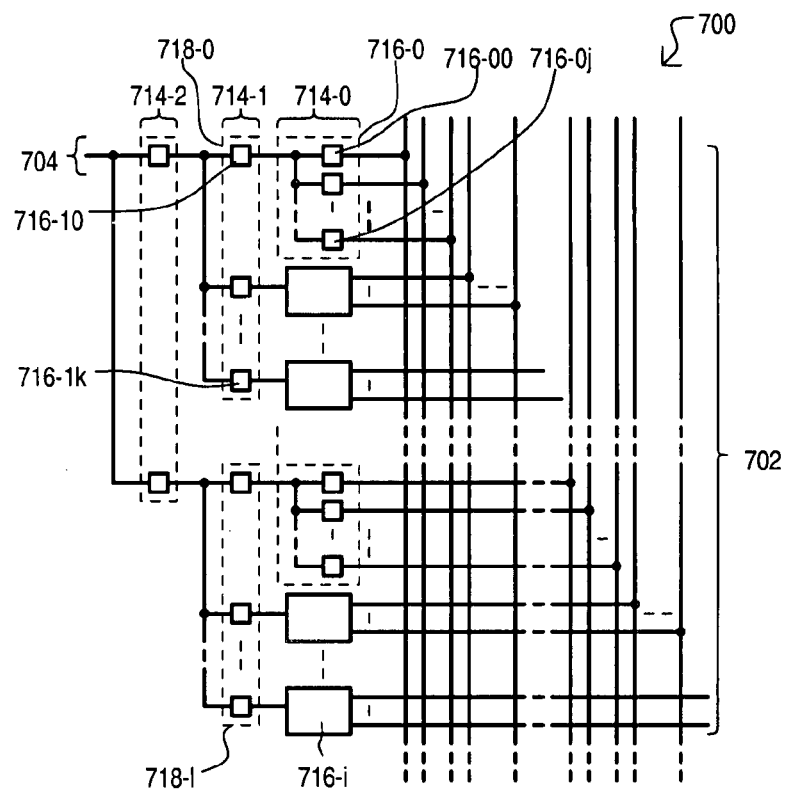
FIG. 7 shows a programmable path circuit according to another embodiment.

FIG. 7 shows a programmable circuit path 700 like that of FIG. 6, but includes higher levels of hierarchy. A programmable circuit path 700 can provide connections between a first I/O set 702 and a second I/O set 704, and includes groups of switching devices arranged into increasingly higher levels in the hierarchy. The very particular example of FIG. 7 shows three different groups 714-0, 714-1 and 714-2.

Groups 714-0 can provide connections between first I/O set 702 and groups 714-1. As but one example, groups 714-0 can include i+1 groups of switch devices (one shown as 716-0), that each include j+1 switch devices (one shown as 716-00). Each group of j+1 can be connected between different I/O lines of set 702 and a same switch device within group 714-1. In a similar fashion, groups 714-1 can include /+1 groups of switch devices (one shown as 718-0), that each include k+1 switch devices (one shown as 716-10). Each group of k+1 can be connected between different groups 714-0 and a same switch device within group 714-2. A highest level of hierarchy can be configured in the same general fashion providing programmable connections between groups 714-1 and second I/O set 704.

It is noted that each switch device of programmable circuit 700 can include a JFET device, preferably a JFET device having two gate terminals, one connected to a memory circuit and another connected to a control circuit.

In this way, programmable circuit paths according to embodiments of the invention can have multiple levels of hierarchy.

Having described various switch block structures, a very particular switch block and method of controlling a switch block will now be described with reference to FIGS. 8A and 8B.

Figure 8A:
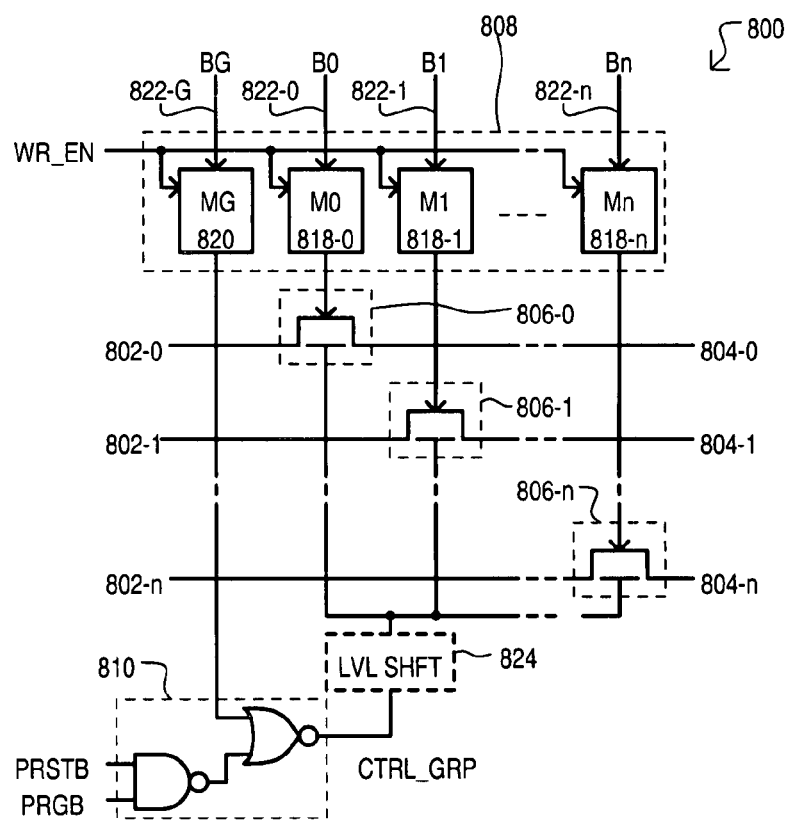
FIGS. 8A and 8B show a switch circuit and operation according to an embodiment.
Figure 8B:
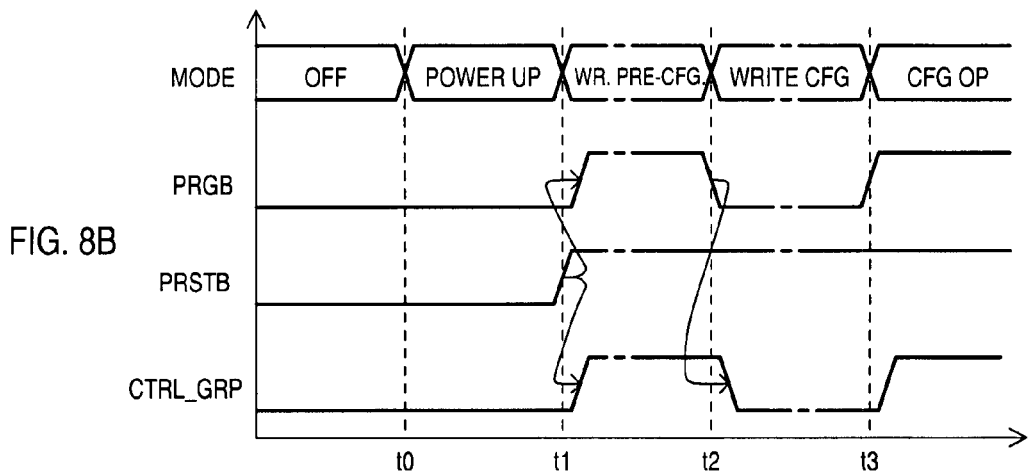

Referring now to FIGS. 8A and 8B, a switch circuit according to one embodiment is shown in a block schematic diagram and designated by the general reference character 800. Particular versions of a switch circuit 800 can be considered related to the embodiments of FIGS. 1 to 3B in that they can include switching devices like those illustrated in these previously described embodiments. Similarly, a switch circuit 800 can be considered related to the embodiments of FIGS. 4 to 7, in that particular versions of switch circuit 800 can be included, in whole or in part, in these previously described circuits.

In the embodiment of FIG. 8A, a switch circuit 800 can include first signal nodes 802-0 to 802-$n$, second signal nodes 804-0 to 804-$n$, switch nJFETs 806-0 to 806-$n$, a memory circuit 808, and a control circuit 810. Each of first signal nodes (802-0 to 802-$n$) can be connected to one of the second signal nodes (804-0 to 804-$n$) by a source-drain path of a corresponding switch nJFET (806-0 to 806-$n$). Switch nJFETs (806-0 to 806-$n$) can have first gates connected to memory circuit 808 and second gates commonly connected to control circuit 810.

A memory circuit 808 can include a number of switch configuration storage circuits that provide configuration signals to switch nJFETs (806-0 to 806-$n$). In the particular example shown, memory circuit 808 includes a storage circuit 818-0 to 818-$n$ corresponding to switch nJFETs 806-0 to 806-$n$, respectively. Optionally, and as shown in FIG. 8A, a memory circuit 808 can also include a group storage circuit 820 that can provide a same configuration value to all nJFETs (806-0 to 806-$n$), according to operation of control circuit 810. Each storage circuit 818-0 to 818-$n$, 820 can receive configuration data values from a corresponding bit line 822-0 to 822-$n$, 822-G, respectively. Write operations to storage circuits (818-0 to 818-$n$, 820) can be enabled according to a write enable signal WR_EN.

In the arrangement of FIG. 8A, a control circuit 810 can apply a common signal CTRL_GRP to all switch nJFETs (806-0 to 806-$n$) in response to input signals PRSTB and PRGB that can indicate modes of operation. More particularly, a control circuit 810 can place all switch nJFETs (806-0 to 806-$n$) into high impedance states when a power-on reset signal PRSTB is active (low in this case) or a program signal PRGB is active (also low in this case). Otherwise, a common signal CTRL_GRP can be applied according to a value stored by group storage circuit 820.

A power-on reset signal PRSTB can be active when a power-on reset condition exists. Similarly, a program signal PRGB can be active when configuration data is being cleared and/or written to a device or portion of a device. As a result, a switch circuit can isolate first signal nodes (802-0 to 802-$n$) from second signal nodes (804-0 to 804-$n$) in such modes. Such operations can be particularly suitable for output portions of a connection block, for example, in order to isolate logic block output signals from driving routing lines when the configuration of such a logic block is not settled or otherwise indeterminate.

The very particular example of FIG. 8A shows a control circuit 810 that includes a two-input NAND gate that receive signals PRSTB and PRGB as inputs, and a two input NOR gate that receives that output of the NAND gate as one input, group storage circuit 820 as another input, and has an output that drives signal CTRL_GRP. However, such an example should not be construed as limiting to the invention. For example, other embodiments may not include a group storage circuit 820, in which case logic can be simpler. Further, logic for generating a signal CTRL_GRP can vary according to input signals received, and active levels of such signals.

Optionally, a level shifter 824 can be included to level shift a signal CTRL_GRP. Such an arrangement can apply an inactive signal (low, in this example) that is lower than a standard logic signal level for a circuit.

Furthermore, while FIG. 8A shows switch nJFET (806-0 to 806-$n$), alternate embodiments can include switch pJFETs.

One operation of the switch circuit 800 of FIG. 8A will now be described with reference to FIG. 8A in conjunction with FIG. 8B. FIG. 8B is a timing diagram that includes waveforms for signals PRGB, PRSTB and CTRL_GRP shown in FIG. 8A. FIG. 8B also includes a waveform MODE, which can indicate an operating mode for an integrated circuit containing a switch circuit 800.

Referring to FIGS. 8A and 8B, prior to time t0, a device can be OFF. That is, power is not applied to a device, and/or power is below some minimum level for proper operation, and/or power has been interrupted. Signals PRGB and PRSTB can be active (low in this case), maintaining switch nJFETs (806-0 to 806-n) in non-conducting states regardless of values stored within storage circuits (818-0 to 818-n).

At about time t0, a device can enter a power up state, which in this embodiment, can be state following adequate power supply levels. A power up state can automatically load configuration data into storage locations of the device, including those of storage circuit 808. However, at this time, signals PRGB and PRSTB can continue to be active, maintaining switch nJFETs (806-0 to 806-n) in non-conducting states, even after configuration values are stored within storage circuits (818-0 to 818-n), and regardless of such stored data values.

At about time t1, a device can switch to a write pre-configuration state. A signal PRSTB can transition to an inactive level (high in this example). In response to such a transition, signal PRGB can also transition to an inactive level. Because signals PRSTB and PRGB are both inactive (high in this example), a switch circuit 800 can provide connections between first signal nodes (802-0 to 802-n) and second signal nodes (804-0 to 804-n) based on default configuration data values from storage circuit 808, which can be random values, or values forced upon start-up.

At about time t2, a device can switch to a write state. In response to write command values input to the device, a signal PRGB can transition to an active state (low in this example). As a result, nJFETs (806-0 to 806-n) can once again be commonly driven into non-conducting states.

At about time t3, a write operation can be completed, and signal PRGB can return to an inactive level (high in this example). Once again, connections between first signal nodes (802-0 to 802-n) from second signal nodes (804-0 to 804-n) can be determined according to configuration data values from storage circuit 808 written into storage circuit 808 between times t2 and t3.

After time t3, a device can now be operational according to configuration data. That is, the device is now programmed to execute a desired function.

An operation like that described by FIG. 8B may be suitable for an output portion of a connection block (like those shown as 404-0/1 in FIG. 4 and in FIG. 5C). In a power-on reset operation or configuration write operation, output signals from a logic block received at one set of signal nodes (e.g., 802-0 to 802-n or 804-0 to 804-n) can be isolated from routing signals lines at the other set of signal nodes (e.g., 804-0 to 804-n or 802-0 to 802-n).

In this way, a switch circuit can have JFET switching devices controlled by both configuration data, as well as a common control signal that can vary according to operational mode.

Figure 9:
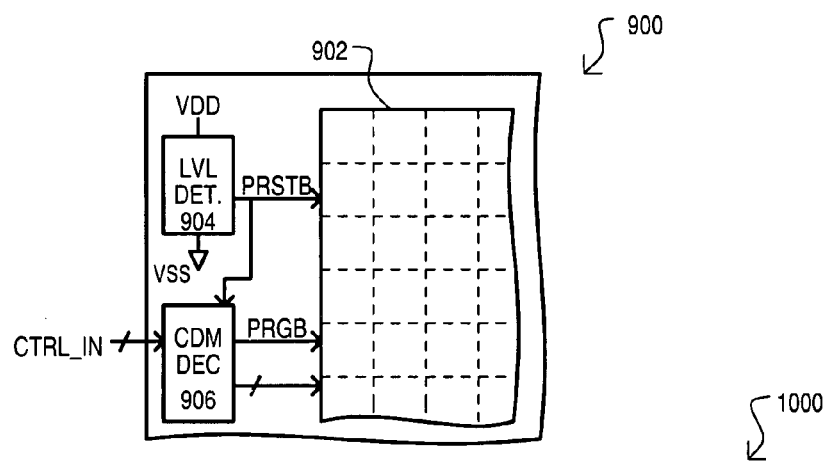
FIG. 9 shows an IC device that can include switch circuits like that shown in FIGS. 8A and 8B.

Referring now to FIG. 9, one example of an IC device that can include a switch circuit like that of FIGS. 8A and 8B is shown in a top plan view, and designated by the general reference character 900. An IC device 900 can include a configurable section 902, a power supply detect circuit 904, and a command decoder 906. Configurable section 902 can include multiple switch circuits, like that of FIGS. 8A and 8B, all connected to receive signals PRSTB and PRGB.

A power supply detect circuit 904 can generate a power-on reset signal PRSTB in response to power supply voltage levels. For example, a power supply detect circuit 904 may only drive a signal PRSTB to an inactive level only after power supply levels have been sustained at adequate levels for predetermined amount of time. Such a time limit can be determined according to various methods, such as the charging of a capacitance at a node, as but one example.

A command decoder circuit 906 can receive control input values CTRL_IN. Provided a power-on reset signal PRSTB is inactive (high in this example), command decoder circuit 906 can generate control signals indicating a mode of operation. Such signals can include signal PRGB indicating a write to all, or a portion of configurable section 902.

In this way, mode signals can be generated for controlling switch circuits in combination with configuration data values.

Having described one switching circuit that can be suitable for use in a connection block circuit, switch circuits suitable for use in switch blocks will now be described with reference to FIGS. 10 to 13. Particular arrangements of the embodiments shown by FIGS. 10 to 13 can be considered related to the embodiments of FIGS. 1 to 3B in that it they can include switching devices like those illustrated in these previously described embodiments. Similarly, these embodiments can be considered related to the embodiments of FIGS. 4 to 7, as particular versions of such switch circuits can be included, in whole or in part, in these previously described circuits.

Figure 10:
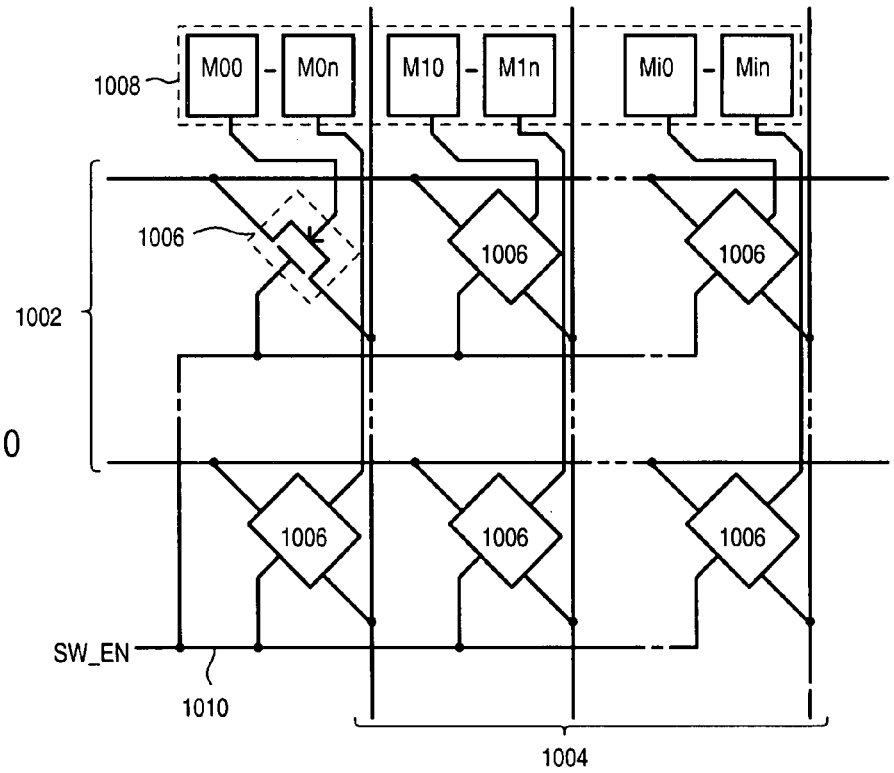
FIG. 10 shows a switch circuit according to another embodiment of the invention.

Referring now to FIG. 10, a switch circuit according to a first embodiment is shown in schematic diagram and designated by the general reference character 1000. A switch circuit 1000 can provide selective interconnections between first signal lines 1002 disposed in a first direction (horizontal in the figure) and a second signal lines 1004 disposed in a second direction different from the first direction (vertical in the figure).

FIG. 10 shows a "cross bar" arrangement having a number of switch elements 1006 that provide a programmable path between each first signal line 1002 and each second signal line 1004. In the example shown, each switch element 1006 can include an nJFET having a first gate connected to a corresponding storage circuit 1008, and a second gate connected to a common node 1010 that can be driven by a control signal SW_EN. A storage circuit 1008 can store a separate data value for each switch element. It is understood that data can be written to storage circuits 1008 according to conventional techniques. A source-drain path of each nJFET can be situated between one of first signal lines 1002 and one of second signal lines 1004.

In one arrangement, a control signal SW_EN can force switch circuit 1000 to provide a predetermined connection. In particular, when signal SW_EN has one value, switch elements (e.g., 1006) can be enabled or disabled according to values stored within a corresponding storage circuit (e.g., 1008). Thus, the switching paths for a switch circuit 1000 vary with configuration data. However, when signal SW_EN has another value, all switch elements (e.g., 1006) can be placed into a high impedance state. Such an arrangement can force switch circuit 1000 to provide signal paths only in the first or second directions (horizontally or vertically), and prevent any signals paths between such directions (between any horizontal line and any vertical line).

An arrangement like that of FIG. 10 can allow a switch circuit 1000 to be placed into one configuration (signal travel in only vertical or horizontal directions), to enable a particular type of operation (e.g., writing of configuration data into a device). Even more particularly, in a programmable logic device, signal lines can be arranged to provide predetermined write data paths while configuration data is written, and can then be configured to provide various other signal paths according to such configuration data.

While FIG. 10 shows switch nJFETs, alternate embodiments can include switch pJFETs.

In this way, a switch circuit can provide programmable connections between signal lines traveling in two different directions, as well as force the switch circuit to provide predetermined signal paths in particular modes of operation.

Figure 11:
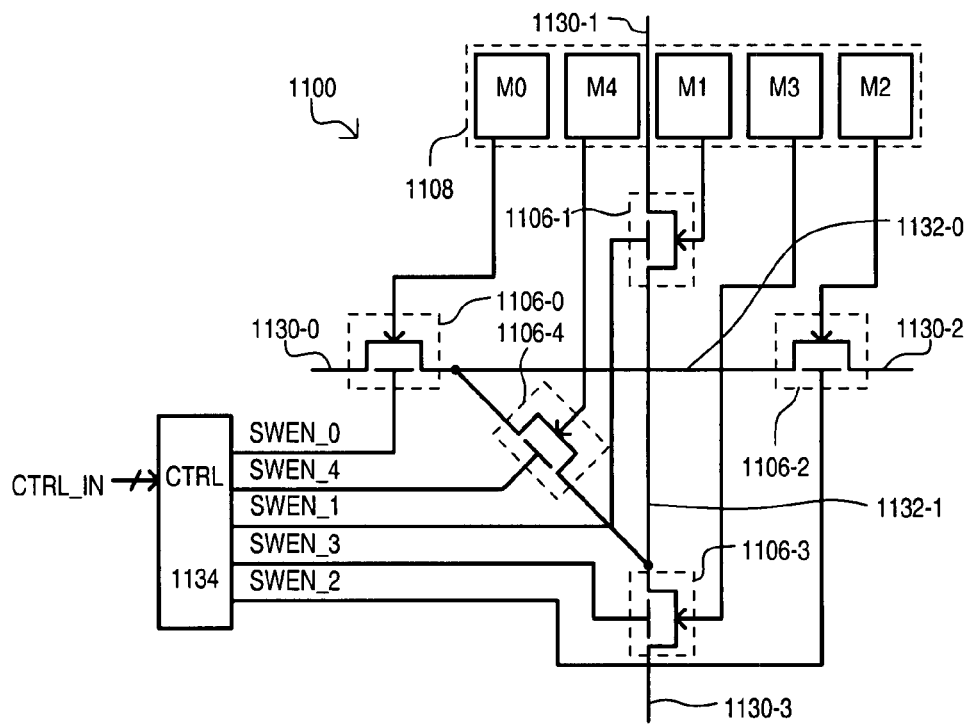
FIG. 11 shows a switch circuit according to yet another embodiment of the invention.
Figure 12:
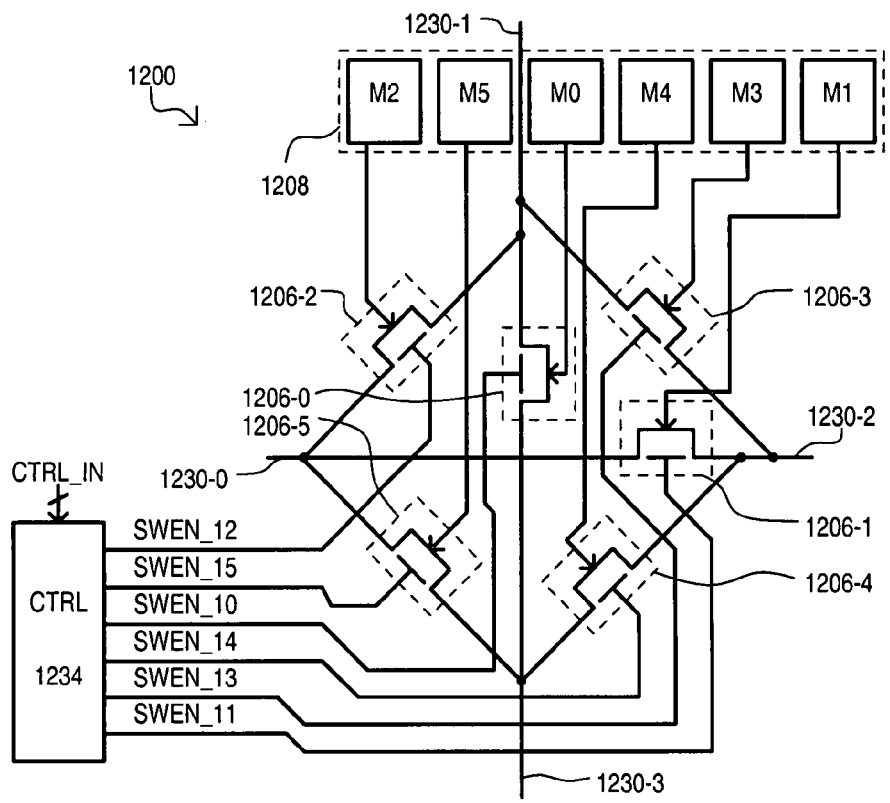
FIG. 12 shows a switch circuit according to a further embodiment of the invention.

While a switch circuit like that of FIG. 10 can commonly drive gates of switch JFETs in a basic crossbar type arrangement, other embodiments can include switching structure that provide greater variation in possible signal connections. Like FIG. 10, an arrangements like that of FIGS. 11 and 12 can enable a switch circuit to placed into a configuration (signal travel in only vertical or horizontal directions) that can be convenient for a particular operation (writing of configuration data). Two such examples are shown in FIGS. 11 and 12. FIGS. 11 and 12 show switch structures that can be formed at intersections of signal paths disposed in different directions. Such switch structures can be repeated numerous times to from a switch block. As but one of the many possible examples, the illustrated switch circuits can be like that shown as 502 in FIG. 5A.

Referring now to FIG. 11, a switch circuit is shown in a block schematic diagram and designated by the general reference character 1100. A switch circuit 1100 can include switch elements 1106-0 to 1106-4, a storage circuit 1108, routing nodes 1130-0 to 1130-3, internal nodes 1132-0 and 1132-1, and a control circuit 1134. Switch elements (1106-0 to 1106-4) can provide programmable connections between the various routing nodes (1130-0 to 1130-3). In the very particular example shown, switch element 1106-0 can provide a programmable path between routing node 1130-0 and internal node 1132-0, switch element 1106-1 can provide a programmable path between routing node 1130-1 and internal node 1132-1, switch element 1106-2 can provide a programmable path between routing node 1130-2 and internal node 1132-0, switch element 1106-3 can provide a programmable path between routing node 1130-3 and internal node 1132-1, and switch element 1106-4 can provide a programmable path between internal nodes 1132-0 and 1132-1.

Storage circuit 1108 can include a storage element corresponding to each switch element 1106-0 to 1106-4. More particularly, storage circuit 1108 can provide a programmable value to a first gate of each nJFET of switch elements (1106-0 to 1106-4). Write input data paths and control paths for storage circuit 1108 are not shown to avoid unduly cluttering the view. In this way, values stored within storage circuit 1108 can allow a switch circuit 1100 to be configured to provide any number of different signal routing paths between routing nodes 1130-0 to 1130-3. More particularly, any routing node can be connected to any other routing node.

A control circuit 1134 can receive input signals CTRL_IN, and in response thereto, provide control signals SWEN_0 to SWEN_4 to second gates of nJFETs within switch element 1106-0 to 1106-4, respectively. Unlike other described embodiments, signals SWEN_0 and SWEN_4 can be driven separately, allowing switch elements 1106-0 to 1106-4 to be placed in different predetermined configurations (e.g., some on while others are off).

Referring now to FIG. 12, a switch circuit according to another embodiment is shown in a block schematic diagram and designated by the general reference character 1200. A switch circuit 1200 can include switch elements 1206-0 to 1206-5, a storage circuit 1208, routing nodes 1230-0 to 1230-3, and a control circuit 1234. As in the case of FIG. 11, switch elements (1206-0 to 1206-5) can provide programmable connections between the various routing nodes (1230-0 to 1230-3). However, such connections can have lower resistance than the case of FIG. 11, as single switch elements can connect between routing nodes (1230-0 to 1230-3). In the very particular example shown, switch element 1206-0 can provide a programmable path between routing nodes 1230-1 and 1230-3, switch element 1206-1 can provide a programmable path between routing nodes 1230-0 and 1230-2, switch element 1206-2 can provide a programmable path between routing nodes 1230-0 and 1230-1, switch element 1206-3 can provide a programmable path between routing nodes 1230-1 and 1230-2, switch element 1206-4 can provide a programmable path between routing nodes 1230-2 and 1230-3, and switch element 1206-5 can provide a programmable path between routing nodes 1230-0 and 1230-3.

Like FIG. 11, a storage circuit 1208 can provide a programmable value to a first gate of each nJFET of switch elements (1206-0 to 1206-5). In addition, write input and control circuits for storage circuit 1208 are not shown to avoid unduly cluttering the view.

A control circuit 1234 can receive input signals CTRL_IN, and in response thereto, provide control signals SWEN_10 to SWEN_15 to second gates of nJFETs within switch element 1206-0 to 1206-5, respectively. Signals SWEN_10 to SWEN_15 can be driven separately, allowing switch circuit 1200 to be placed in more than one predetermined configuration.

Figure 13:
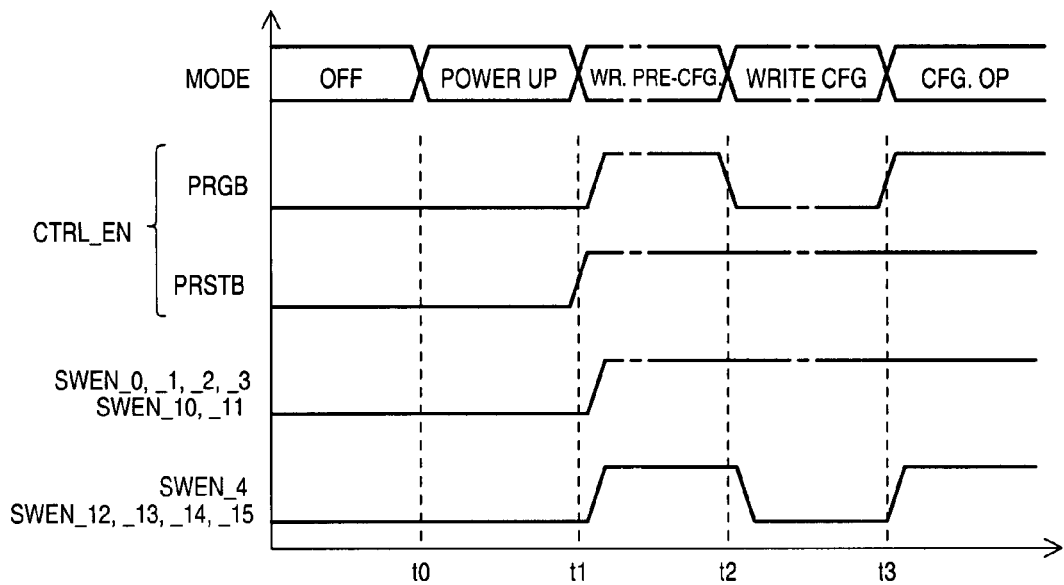
FIG. 13 is a timing diagram showing operations for switch circuits of FIGS. 11 and 12.

Referring now to FIG. 13, a timing diagram shows operations for switch circuits of FIGS. 11 and 12. FIG. 13 shows waveforms for control signals PRSTB and PRGB which can signify power-on reset and/or program operations, as described above with reference to FIG. 8B, as well as a mode signal MODE, that can indicate a mode of operation for an IC device containing such switch circuits. FIG. 13 also shows responses for control signals SWEN_0 to SWEN_4 of FIG. 11, as well as control signals SWEN_10 to SWEN_15 of FIG. 12.

Operations shown by FIG. 13 can generally follow those shown in FIG. 8B. However, as shown between times t1 to t2, in an operational mode all switch elements (1206-0 to 1206-5) can be enabled, unlike the arrangement of FIGS. 8A and 8B, which can disable all switch elements.

In addition, as shown between times t2 and t3, in a write operation, switch circuits 1100 and 1200 can be configured to provide a predetermined signal path. In particular, both switch circuits 1100 and 1200 enable signal transmission in either the vertical direction or horizontal direction, but not between the two.

While FIGS. 10 to 12 show circuits with switch nJFETs, alternate embodiments can include switch pJFETs. Further, it is understood that circuits like that shown in FIGS. 10 to 12 can include control signals that are boosted with respect to standard logic swings in the device. As but one very particular example, in the event standard logic signals swing between about 0 volts and +0.5 volts, a boosted control signal for a second gate of an nJFET can swing between about +0.5 volts and −0.5 volts. Similarly, a boosted control signal for a second gate of a pJFET can swing between about +0 volts and +1.0 volts.

In this way, switch circuits can provide interconnections between signals paths traveling in two different directions based on configuration data and control signals applied to same switching elements in the circuit.

Having described various circuits that include switch elements controlled, at least in part, by storage circuits, various examples of storage circuits will now be described with reference to FIGS. 14A to 17B. In very particular cases, storage circuits shown in FIGS. 14A to 17B can be considered related to the previously described embodiments, in that such storage circuits can be included in these previously described embodiments.

Figure 14A:
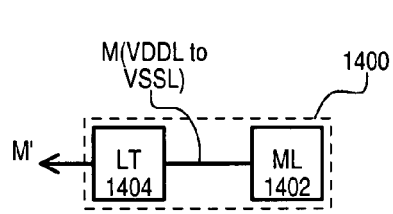
FIGS. 14A to 14C show examples of storage circuits that can be included in embodiments of the invention.

Referring now to FIG. 14A, a storage circuit according to one embodiment is shown in a block schematic diagram and designated by the general reference character 1400. A storage circuit 1400 can include a storage element 1402 and a level translator circuit 1404. A storage element 1402 can output a configuration value M that can range between a first logic level VDDL and a second logic level VSSL. A level translator circuit 1404 can level shift such value to generate an output configuration value M' that can have a logic level outside of the range of VDDL to VSSL.

Figure 14B:
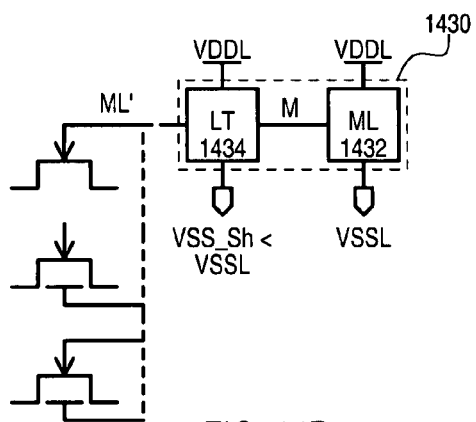

Referring now to FIG. 14B, a storage circuit according to another embodiment is shown in a block schematic diagram and designated by the general reference character 1430. Like the storage circuit of FIG. 14A, storage circuit 1430 can include a storage element 1432 and a level translator circuit 1434. A storage element 1432 can receive a high power supply voltage VDDL and a low power supply voltage VSSL, which can be typical logic signals of an integrated circuit device containing the storage circuit. Storage element 1432 can output an initial configuration value M that can vary between VSSL and VDDL.

A level translator circuit 1434 can receive a high power supply voltages VDDL and a shifted low power supply voltage VSS_Sh that can be lower than VSSL. In response to value M, level translator circuit 1434 can provide an output value ML' that can vary between VDDL and VSS_Sh. Such a value may be suitable for controlling the operation of nJFET devices. FIG. 14B includes a dashed line. This dashed line illustrates how a value ML' can be applied to one or multiple nJFET switch devices, at a top gate, bottom gate, or both a top and bottom gate.

Figure 14C:
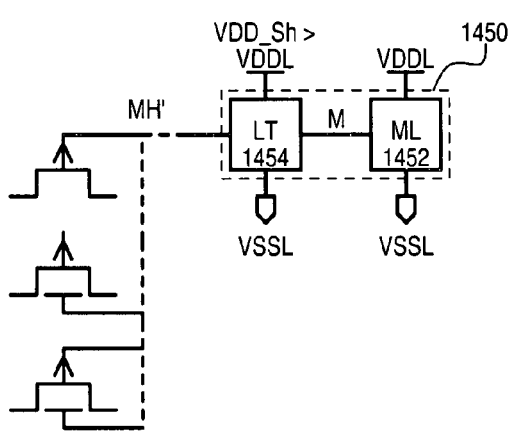

Referring now to FIG. 14C, a storage circuit according to another embodiment is shown in a block schematic diagram and designated by the general reference character 1450. Storage circuit 1450 can have the same general features as storage circuit 1430 shown in FIG. 14B. However storage circuit 1450 can differ from that of FIG. 14B in that a level translator circuit 1454 can receive a shifted high power supply voltage VDD_Sh, which can be higher than VDDL. In response to value M, level translator circuit 1454 can provide an output value MH' that can vary between VSSL and VDD_Sh. Such a value may be suitable for controlling the operation of pJFET devices. As in the case of FIG. 14B, FIG. 14C includes a dashed line that illustrates how a value MH' can be applied to a top gate, bottom gate, or both a top and bottom gate of one or multiple pJFET switch devices.

Figure 15:
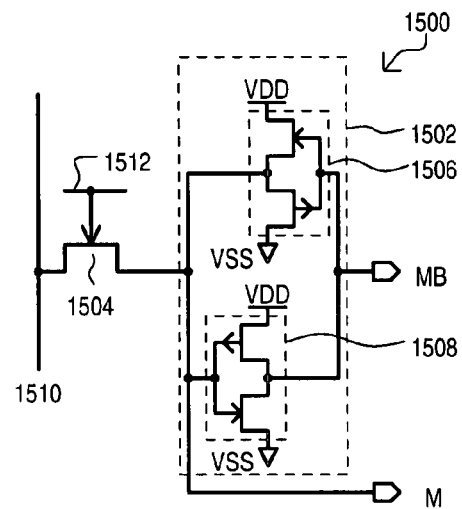
FIG. 15 shows a storage element that can be included in storage circuits like those of FIGS. 14A to 14C.

Referring now to FIG. 15, one very particular example of storage element that can be included in the embodiments is shown in a schematic diagram and designated by the general reference character 1500. A storage element 1500 can be a static random access memory (SRAM) type cell that can include a latch 1502 and an access device 1504. A latch 1502 can store and output a data value. In the example shown, latch 1502 can be formed by cross-coupled inverters 1506 and 1508. Each inverter (1506 and 1508) can be composed of a pJFET and nJFET having source-drain paths arranged in series, as well as commonly connected control gates and drains. In the particular example shown, inverter 1508 can output an inverted data value MB, while inverter 1506 can output a non-inverted data value M.

An access device 1504 can provide a path for data to be written into a latch 1502. FIG. 15 shows an example of a single ended arrangement, and thus access device 1504 can include an nJFET having a source-drain path connected between a bit line 1510 and latch 1502. Access device 1504 can be controlled according to a write access line 1512. In some embodiments, a write access line 1512 can also be used to read data from latch 1502 onto bit line 1510.

It is noted that embodiments of the present invention can include storage elements that do not level shift stored values. As but one very particular example, a storage element can take the form of the SRAM latch shown in FIG. 15.

Referring now to FIGS. 16A and 16B, two examples of level translator circuits that can be included in the embodiments are shown in schematic diagrams. FIG. 16A shows a level translator 1600 that includes pJFETs P160 and P161, nJFETs N160 and N161, an inverter I160, and an output stage that includes driver pull-up pJFET P164 and driver pull-down nJFET N164. Transistors P160 and P161 can have cross-coupled gate-drain connections with sources commonly connected to a high shifted power supply voltage VDD_Sh. Transistor N160 can have a source-drain path in series with that of transistor P160, and a gate that receives an input signal VIN, that can vary between a low power supply voltage VSSL and a high power supply voltage VDDL. Inverter I160 can have an input that receives input signal VIn and an output connected to a gate of transistor N161. Transistor N161 can have a source-drain path in series with that of transistor P161.

Driver pJFET P164 can have a source connected to a high shifted power supply voltage VDD_Sh, and a gate connected to the drain-drain connection of transistors P160 and N160. Driver nJFET N164 can have a source connected to low power supply voltage VSSL, and a gate connected to the output of inverter I160. An output signal VOUT can be provided at a drain-drain connection of transistors P164 and N164.

In operation, when VIN transitions low, transistor N160 can be turned off and inverter I160 can turn on transistor N164. This can drive output VOUT low. At the same time, inverter I160 can turn on transistor N161, which in turn can turn on transistor P160. This can turn off transistors P161 and P164. As a result, VOUT can be driven low to VSSL. When VIN transition high, level translator circuit 1600 can work in the opposite fashion with respect to circuit legs. Inverter I160 can turn off transistors N161 and N164, and transistor N160 can be turned on. This can drive the gate of transistor P161 and P164 low, which can turn on transistor P164. As a result, VOUT can be driven high to VDD_Sh, and transistor P160 can be turned off.

FIG. 16B shows a level shifter 1650 having the same general arrangement as that of FIG. 16A, but configured to drive an output signal VOUT that can vary between a high supply voltage VDDL and a shifted low supply voltage VSS_Sh.

In this way, a storage circuits can include built-in level shifting capabilities.

While embodiments described above have shown switch elements that receive configuration data values from separate storage circuits, alternate embodiments can include switch elements with "built-in" storage circuits. In particular, embodiments can include JFETs having an isolated gate structure that can be charged to alter the conductivity of a corresponding channel of the JFET. Two possible examples of such an arrangement are shown in FIGS. 17A and 17B.

FIG. 17A is a block schematic diagram of a switch element, designated by the general reference character 1700. A switch element 1700 can be substituted for switch elements (i.e., switch nJFETs or pJFETs) described above. A switch element 1700 can provide a programmable signal path between a first routing node 1702-0 and a second routing node 1702-1. A switch element 1700 can include an isolated gate JFET 1704, mode circuit 1706, and a programming circuit 1708. An isolated gate JFET 1704 can have a bottom gate that can be charged and then retain such charge. A channel conductivity of JFET 1704 can vary according to the charge (if any) on the corresponding isolated gate.

In one particular arrangement, an isolated gate can be a semiconductor region in contact with a channel region, but doped to a conductivity type different from that of the channel region. Such an isolated gate can be separated from a control gate, source or drain by the channel or an isolation structure. Further, an isolated gate can be programmed via punch-through operation according to configuration data. The isolated gate can then be allowed to float, and thus establish a state of conductive path through JFET 1704. In one configuration, an isolated gate of a JFET 1704 can be clearly distinguishable from a "floating" gate of a nonvolatile memory cell, as it is not entirely separated from a channel region by a dielectric layer, and makes physical contact with a channel region.

Mode circuit 1706 can include a source MUX 1706-0 and a gate MUX 1706-1. MUXs (1706-0 and 1706-1) and can be controlled according to a signal MODE. When signal MODE has a first value, source MUX 1706-0 can enable routing node 1702-0 to be connected to a source of JFET 1704, and gate MUX 1706-1 can enable a control signal CTRL_T to be applied to a top gate of JFET 1704. When signal MODE has a second value, a source and gate of JFET 1704 can be connected to a programming circuit 1708.

A programming circuit 1708 can generate programming voltages for programming JFET 1704 (e.g., charging the isolated gate). For example, a programming circuit 1708 can generate a sufficiently large first gate voltage and source voltage to cause punchthrough to the isolated gate. A programming circuit 1708 can also generate voltages sufficient to discharge an isolated gate. As but one example, an isolated gate can be discharged by forward biasing p-n junction formed by the isolated gate and the channel in combination with a source and/or drain. As noted above, a mode circuit 1706 can enable such programming and erase voltages to be applied to JFET 1704.

While JFET 1704 is shown as an nJFET, an alternate embodiment can include a pJFET.

While an arrangement like that of FIG. 17A can provide for a compact switch structure with a built-in configuration store, programming a JFET via signal paths (i.e., source of a JFET) can undesirably include MUXs to switch between operational signals and program erase signals. Such MUXs may have to be high voltage circuits capable of sustaining voltage levels necessary to punchthrough to an isolated gate.

An alternate switch element that does not include such MUXs is shown in FIG. 17B.

FIG. 17B is a block schematic diagram of a switch element, designated by the general reference character 1750. A switch element 1750 can be substituted for switch elements (i.e., switch nJFETs or pJFETs) described above. A switch element 1700 can provide a programmable signal path between a first routing node 1752-0 and a second routing node 1752-1. A switch element 1750 can include a switch JFET 1754, a program JFET 1756, and a programming circuit 1758.

Switch JFET 1754 and program JFET 1756 can be isolated gate devices, as noted above, but can share a common isolated gate. Further, program JFET 1756 can have a source, control gate and optionally a drain connected to a programming circuit 1758. In such an arrangement, when a program JFET 1756 is programmed to particular state, by operation of shared isolated gate, switch JFET 1754 can have the same state. Such an arrangement can obviate the need for multiplexing write values to a switch path device.

As in the case of FIG. 17A, switch and program JFETs (1754 and 1756) can also be pJFETs.

In this way, a switch device with a JFET can have "built-in" storage of a configuration data value.

Referring now to FIGS. 18A and 18B, particular examples of possible JFET devices are shown in side cross sectional views. FIG. 18A shows an nJFET having two gates, while FIG. 18B shows an nJFET having an isolated gate.

Referring to FIG. 18A, an nJFET 1800 can include a bottom gate 1802, a channel region 1804, isolation structures 1806, a top gate 1808, a source terminal 1810, and a drain terminal 1812. A bottom gate 1802 can be a semiconductor region doped to a first conductivity type that can be accessed via a terminal, which in the example shown can include an access portion 1814 that extends vertically (e.g., perpendicular to a substrate surface containing nJFET 1800) to an electrode 1816, both of which can be semiconductor material doped to the same conductivity type as bottom gate 1802. In one very particular example, a bottom gate 1802 and access portion 1814 can be formed by ion implantation steps into a silicon substrate.

A channel region 1804 can be formed over and in contact with a bottom gate 1802, and can be a semiconductor region doped to a second conductivity type. In one very particular example, a channel region 1804 can be formed by ion implantation steps into a silicon substrate.

Isolation structures 1806 can provide electrical isolation for nJFET in a lateral direction (e.g., parallel to a substrate surface). In one particular arrangement, isolation structure 1806 can be formed with shallow trench isolation (STI) techniques.

In one very particular arrangement, a top gate 1808, source terminal 1810, drain terminal 1812, and electrode 1816 can be formed by doping and patterning a same deposited layer, or combination of layers. Top gate 1808 can be doped to an opposite conductivity type as channel region 1804. Source and drain terminals (1810 and 1812) can be doped to a same conductivity type as channel region 1804. In one very particular approach, top gate 1808, source terminal 1810, and drain terminal 1812 can be formed by doping and patterning a layer of polysilicon formed on and in contact with a silicon substrate surface. Further, there can be outdiffsion of dopants from such structures into a substrate. In the very particular example shown, a top gate 1808 can include a portion extending into a substrate. In addition, source and drain regions can be formed within a substrate below source terminal 1810 and drain terminal 1812, respectively.

Referring now to FIG. 18B, an nJFET having an isolated gate is shown in a side cross sectional view and designated by the general reference character 1850. An nJFET can include some of the same general elements as nJFET of FIG. 18A. Thus, an isolated gate nJFET 1850 can include a channel region 1854, isolation structures 1856, a top gate 1858, a source terminal 1860, and a drain terminal 1862.

Unlike the arrangement of FIG. 18A, nJFET 1850 can also include an isolated bottom gate 1864. An isolated bottom gate 1864 can be a semiconductor region doped to a conductivity type opposite to that of a channel region 1854, like the bottom gate 1802 of FIG. 18A. However, isolated bottom gate 1864 is not directly accessible by any terminal, and remains isolated from a top gate 1858, source terminal 1860 and drain terminal 1862 by channel region 1854. As indicated by dashed lines, an isolated bottom gate 1864 can extend in a lateral direction to isolation structures 1856.

It is understood that FIGS. 18A and 18B show exemplary JFET devices, and circuits according to the various embodiments should be construed as being limited to such particular structures. Further, the corresponding pJFETs devices could have the same structure, with an oppositely doped regions/structures.

While embodiments of the present invention can include switch structures, switch methods of operation, and programmable logic device circuits, embodiments can also include IC device methods. One example of such a method is shown in a state diagram in FIG. 19.

Figure 19:
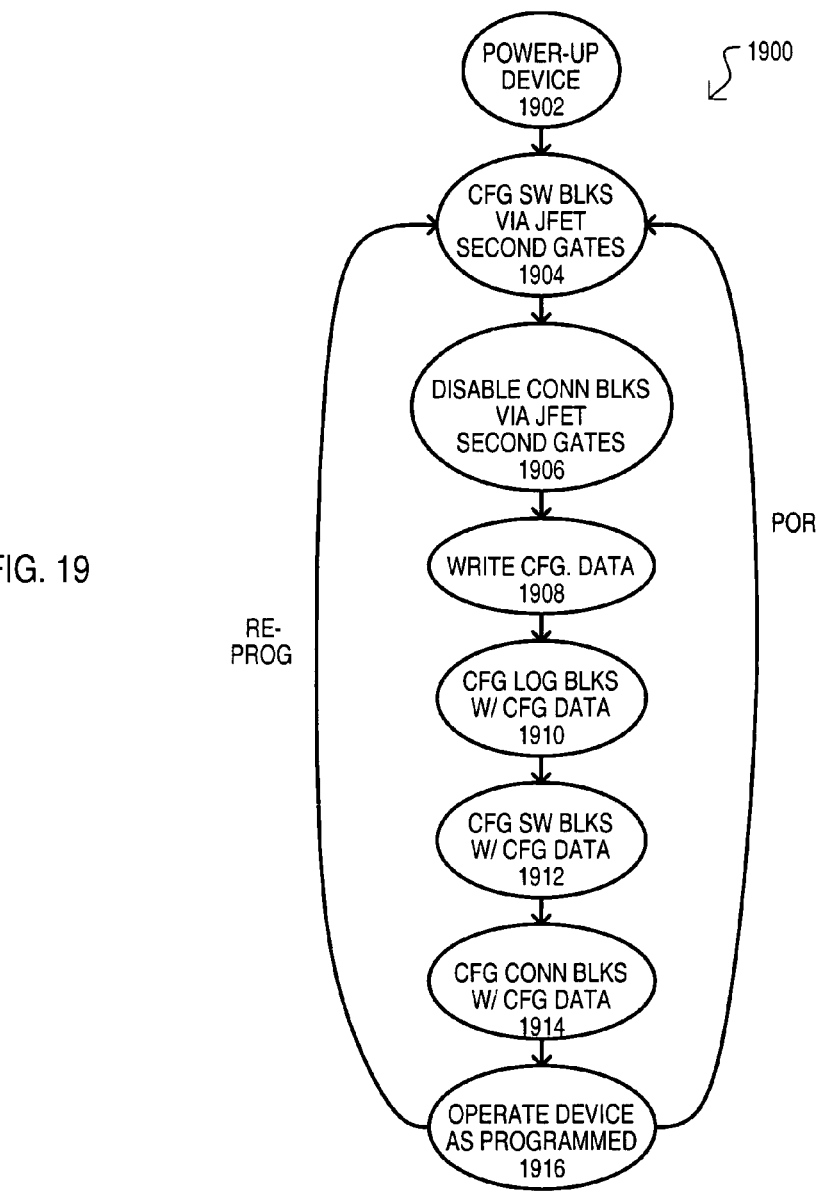
FIG. 19 shows a method according to an embodiment.

Referring now to FIG. 19, a method 1900 can include powering up a device (state 1902). Such an operation can include applying power to an IC device.

A method 1900 can then configure switch blocks according to JFET second gates (state 1904). Such an operation can include driving second gates of FETs within switch blocks with logic generated signals indicating mode, rather than according to configuration data values. In this way, predetermined signal paths through the IC device can be created. As but one example, write data paths can be created for enabling access to storage circuits for storing configuration data.

A method 1900 can further include disabling connection blocks according to JFET second gates (state 1906). Such an operation can include driving second gates of such JFET devices in order to place channels of the devices into high impedance states. Preferably, such an operation can isolate output paths from programmable logic blocks to routing lines, preventing bus contention conditions from occurring on such lines.

A method 1900 can then write configuration data (state 1908). Such an operation can include inputting write data to device, and then storing such data in configuration storage circuits. As but one very particular example, such an operation can include shifting in configuration data in serial fashion to data registers, and then writing such data to storage circuits from such registers.

A method 1900 can then include configuring logic blocks with configuration data (state 1910). Such an operation can include outputting configuration data to programmable logic circuits to enable an IC device to provide a desired logic function.

A method 1900 can then include configuring switch blocks with configuration data (state 1912). Such an operation can include outputting configuration data to switch blocks, and releasing control of such switch blocks via second gates of JFETs.

A method 1900 can then include configuring connection blocks with configuration data (state 1914). Like state 1912, such an operation can include relinquishing control of JFETs via second gates, and allowing configuration data to control such devices. While states 1910 to 1914 can proceed in various orders, preferably state 1914 occurs after 1910 and 1912.

It is noted that in embodiments having storage elements like those of FIGS. 17A, 17B and/or 18B, states 1910 to 1914 can include charging (or not charging) isolated gates according to received configuration data, and then periodically refreshing such values if needed.

A method 1900 can then operate a device as programmed (state 1916). Such a step can include allowing an IC device to execute functions according to its configured state as established by configuration data.

Referring still to FIG. 19, various actions can result in a method 1900 returning to a state 1904. In the particular example shown, in the event an IC device is to be reprogrammed (event "RE-PRG"), a method 1900 can return to state 1904. Similarly, in the event an IC device experiences a power-on reset (event "POR"), a method 1900 can return to state 1904.

In this way, a method can allow a device to be programmed by configuring switch structures via JFET second gates.

Figure 20:
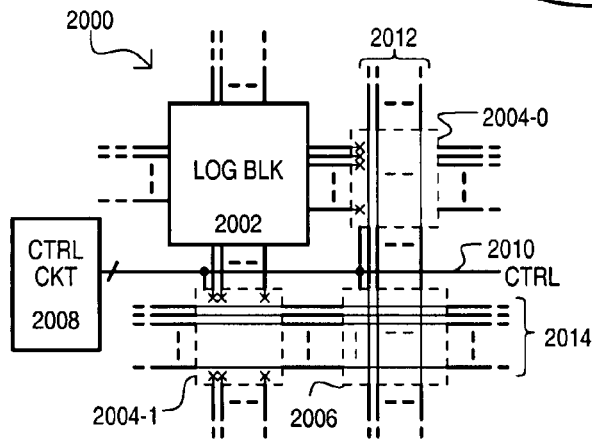
FIG. 20 shows a programmable logic device state according to the method of FIG. 19.
Figure 21:
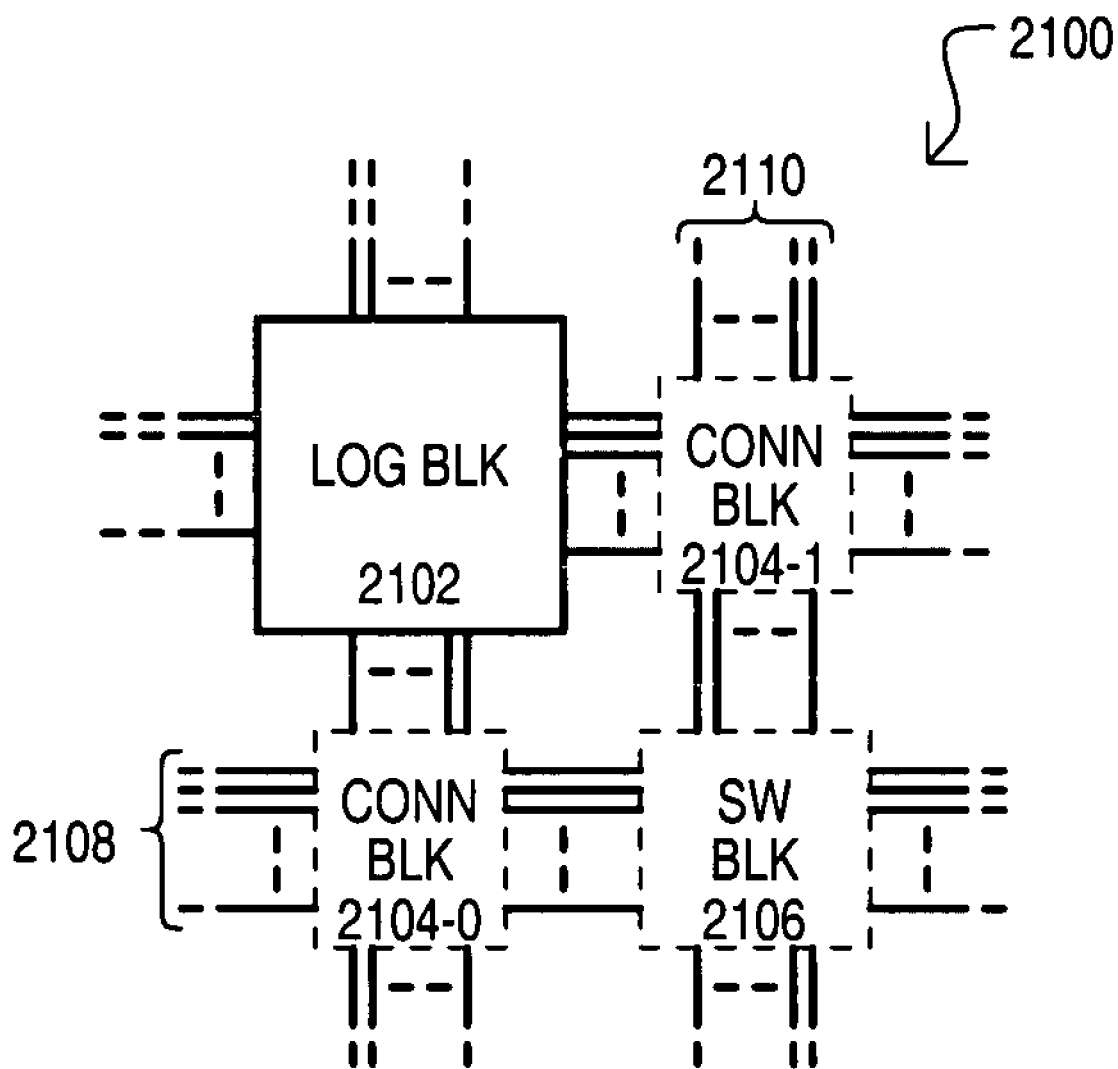
FIG. 21 shows a conventional field programmable gate array.

Referring now to FIG. 20, one very particular example of a programmable logic device is shown at a state 1906 of FIG. 19. A programmable logic device 2000 can include a logic block 2002, connection blocks 2004-0 and 2004-1, a switch block 2006, and a control circuit 2008. Control circuit 2008 can provide control signals CTRL to connection blocks (2004-0 and 2004-1) and switch block 2006 on control bus 2010.

In a state 1906, by operation of control signals CTRL, connection block 2004-0 can isolate logic block 2002 from first routing path 2012. Similarly, connection block 2004-1 can isolate logic block 2002 from second routing path 2014. In one arrangement, only outputs from a logic block 2002 can be isolated.

At the same time, switch block 2006 can be configured to provide a particular signal routing. In the particular example of FIG. 20, switch block 2006 can be configured to prevent interconnections between first and second routing paths (2012 and 2014).

It is understood that FIG. 20 represents but one very particular example of how a programmable logic device can be operated, and should not be construed as limiting to the invention.

Reference in the description to "one embodiment" or "an embodiment" means that a particular feature, structure, or characteristic described in connection with the embodiment is included in at least one embodiment of the invention. The appearance of the phrase "in one embodiment" in various places in the specification do not necessarily all refer to the same embodiment. The term "to couple" or "electrically connect" as used herein may include both to directly and to indirectly connect through one or more intervening components.

Further it is understood that the embodiments of the invention may be practiced in the absence of an element or step not specifically disclosed. That is, an inventive feature of the invention may include an elimination of an element.

While various particular embodiments set forth herein have been described in detail, the present invention could be subject to various changes, substitutions, and alterations without departing from the spirit and scope of the invention.

What is claimed is:

1. A switching circuit, comprising:
a plurality of first signal lines of a programmable logic device;
a plurality of second signal lines of the programmable logic device;
a plurality of storage elements that each provide configuration data;
a plurality of switch elements, each switch element selectively coupling one first signal line to a second signal line and including at least one switch junction field effect transistor (JFET) having a first control gate separated from a second control gate by a channel region;
each switch JFET has the first control gate coupled to receive configuration data and the second gate control coupled to a different control input; and
a switch control circuit coupled to the different control inputs of the switch JFETs that provides different sets of signal values to the control inputs according to an indicated mode of operation.

2. The switching circuit of claim 1, wherein:
at least one storage element comprises
a latch circuit, and
at least one pass transistor coupled between a bit line and the latch circuit.

3. The switching circuit of claim 1, wherein:
a plurality of the switch JFETs have their second control gates commonly coupled to a group control input.

4. The switching circuit of claim 3, further including:
a switch control logic circuit that activates a group control signal in response to at least a first control signal; and
the group control input is coupled to receive the group control signal.

5. The switching circuit of claim 4, further including:
a power-on reset circuit that activates the first control signal in response to predetermined power supply voltage levels of the programmable logic device.

6. The switching circuit of claim 3, further including:
a group storage circuit that receives and stores a group store value; and
the group control input is coupled to receive the group store value.

7. The switching circuit of claim 4, further including:
a plurality of storage elements that each provide configuration data;
each switch JFET has the first gate coupled to receive the configuration data; and
a program control circuit that activates the first control signal in response to a predetermined control value being inputted to the programmable logic device, indicating that configuration data is being stored in the storage elements.

8. The switching circuit of claim 1, wherein:
the plurality of first signal lines are output signal lines of a configurable logic block of the programmable logic device; and
the plurality of second signals lines are routing lines disposed between configurable logic blocks of the programmable logic device.

9. The switching circuit of claim 1, wherein:
the plurality of first signal lines and the plurality of second signals lines are routing lines disposed between configurable logic blocks of the programmable logic device.

10. The switching circuit of claim 1, wherein:
at least one set of the signal values of the switch circuit in a program mode of operation enables a predetermined connection between the first signal lines and the second signal lines regardless of configuration data values stored in the storage elements.

11. A programmable logic device, comprising:
a plurality of circuit blocks, each circuit block configurable in response to user provided data values applied at first gates of switch junction field effect transistors (JFETs) and control signals applied at second gates of the switch JFETs; wherein
the plurality of circuit blocks includes at least one output connection block having at least one output de-multiplexer (de-MUX) that selectively connects configurable logic block output nodes to any of a plurality of routing signal lines for interconnecting configurable logic blocks to one another, the at least one output de-MUX having at least one switch JFET.

12. The programmable logic device of claim 11, further including:
a plurality of configurable logic blocks; and
the plurality of circuit blocks includes at least one switch block that selectively interconnects sets of routing signal lines for interconnecting the configurable logic blocks, each switch block including a plurality of connection structures comprising at least one switch JFET.

13. The programmable logic device of claim 12, wherein:
each connection structure is formed at an intersection of a first signal path disposed in a first direction and a second signal path disposed in a second direction different from the first direction, each connection structure including
a plurality of switch JFETs, and
a control circuit that provides control signals to second gates of the at least five switch JFETs to provide a predetermined connection between the first and second signal paths.

14. The programmable logic device of claim 13, wherein:
the predetermined connection includes enabling the first signal path and enabling the second signal path.

15. The programmable logic device of claim 11, wherein:
each output de-MUX includes
a plurality of switch JFETs sets, the drains of the switch JFETs in each set being commonly coupled to one another, and
a control circuit that provides the control signals to second gates of the switch JFETs, the control signals placing the switch JFETs into a high impedance state.

16. The programmable logic device of claim 11, wherein:
the plurality of circuit blocks includes at least one input connection block having at least one input multiplexer (MUX) that selectively connects any of a plurality of routing signal lines for interconnecting configurable logic blocks to one another to configurable logic block input nodes, the at least one input MUX having at least one switch JFET.

17. A method of controlling a signal routing path in a programmable logic device (PLD), the method comprising the steps of:
including at least one configurable logic block within said PLD;
providing at least one input line and at least one output line for the configurable logic block;
forming at least one connection block within said PLD to conditionally connect a first signal node to a second signal node of said signal routing path; wherein
said connection block comprising a switch junction field effect transistor (JFET) having a first control gate and a second control gate;
coupling the output line of the logic block to the switch JFET's first control gate to communicate a configuration data, stored in the logic block, to said first control gate; and
in response to a first mode indication, communicating a predetermined signal to the switch JFET's second control gate to prevent the output line of the logic block from driving said signal routing path.

18. The method of claim 17, wherein said switch JFET comprises an n-type channel JFET.

19. The method of claim 17, wherein said switch JFET comprises a p-type channel JFET.

20. The method of claim 17, wherein said switch JFET further includes:
a source terminal coupled to said first signal node and a drain terminal coupled to said second signal node;
a means for enabling or disabling the source-drain path as a function of a predetermined gate voltage applied to said second control gate; and
said first control gate being separated from said second control gate by a channel region of said switch JFET.

21. The method of claim 17, wherein:
said configuration data determining whether the switch JFET is to be to turned-on or turned-off, and if turned-on, then a particular signal can propagate from said first signal node to said second signal node, and if turned-off, then said particular signal cannot propagate.

22. The method of claim 17, wherein said first mode indication is generated in response to a power-on reset of said PLD.

23. The method of claim 17, wherein said first mode indication is being generated in response to a program signal indicating that said configuration data, previously stored or to be written into the logic block via the input line, is being erased or written to said PLD.

24. The method of claim 17 wherein preventing the output line from driving the signal routing path includes isolating said first signal node from said second sign nodes when said configuration is not settled or otherwise indeterminate.

25. The method of claim 17, further including:
in response to a configuration mode, providing a signal conducting path through the connection block of varying impedance, and from said first signal node to said second signal node, by applying a predetermined signal to the switch JFET's second control gate and by coupling a configuration data, provided via the logic block's output line, to the switch JFET's first control gate.

26. The method of claim 25, further including:
level shifting a particular signal comprising a predetermined signal or said configuration data, to generate a boosted logic level for the signal or configuration data that is outside of the range of standard logic signal swings.

27. The method of claim 26, wherein said boosted logic level comprises a range of about from −0.5 volts to about +1.0 volts.

28. The method of claim 26, further including:
in response to applying said boosted logic level to said switch JFET, enabling multi-directional conducting paths for signals traveling in different directions including horizontally or vertically.

* * * * *